(12) United States Patent
Kawahara et al.

(10) Patent No.: US 9,711,639 B2
(45) Date of Patent: Jul. 18, 2017

(54) MULTIPLE SHIELDING TRENCH GATE FET

(71) Applicant: Texas Instruments Incorporated, Dallas, TX (US)

(72) Inventors: Hideaki Kawahara, Plano, TX (US); Seetharaman Sridhar, Richardson, TX (US); Christopher Boguslaw Kocon, Mountain Top, PA (US); Simon John Molloy, Allentown, PA (US); Hong Yang, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/049,209

(22) Filed: Feb. 22, 2016

(65) Prior Publication Data
US 2016/0329423 A1 Nov. 10, 2016

Related U.S. Application Data

(63) Continuation of application No. 14/706,927, filed on May 7, 2015, now Pat. No. 9,299,830.

(51) Int. Cl.
*H01L 29/78* (2006.01)
*H01L 29/40* (2006.01)
(Continued)

(52) U.S. Cl.
CPC .... *H01L 29/7813* (2013.01); *H01L 21/28114* (2013.01); *H01L 29/063* (2013.01);
(Continued)

(58) Field of Classification Search
CPC . H01L 29/7811; H01L 29/063; H01L 29/402; H01L 29/66712; H01L 29/407;
(Continued)

(56) References Cited

U.S. PATENT DOCUMENTS 8,748,976 B1 6/2014 Kocon
2006/0267084 A1 11/2006 Rosner et al.
(Continued)

FOREIGN PATENT DOCUMENTS

WO 2014138453 A1 9/2014

*Primary Examiner* — Nathan W Ha
(74) *Attorney, Agent, or Firm* — Tuenlap D. Chan; Charles A. Brill; Frank D. Cimino

(57) ABSTRACT

A semiconductor device contains a vertical MOS transistor having a trench gate in trenches extending through a vertical drift region to a drain region. The trenches have field plates under the gate; the field plates are adjacent to the drift region and have a plurality of segments. A dielectric liner in the trenches separating the field plates from the drift region has a thickness great than a gate dielectric layer between the gate and the body. The dielectric liner is thicker on a lower segment of the field plate, at a bottom of the trenches, than an upper segment, immediately under the gate. The trench gate may be electrically isolated from the field plates, or may be connected to the upper segment. The segments of the field plates may be electrically isolated from each other or may be connected to each other in the trenches.

10 Claims, 28 Drawing Sheets

(51) Int. Cl.
*H01L 29/66* (2006.01)
*H01L 21/28* (2006.01)
*H01L 29/06* (2006.01)
*H01L 29/423* (2006.01)

(52) U.S. Cl.
CPC ........ *H01L 29/0649* (2013.01); *H01L 29/404* (2013.01); *H01L 29/407* (2013.01); *H01L 29/4236* (2013.01); *H01L 29/66734* (2013.01)

(58) Field of Classification Search
CPC ........... H01L 21/28114; H01L 29/7813; H01L 29/404; H01L 29/4236; H01L 29/66734
See application file for complete search history.

(56) References Cited

U.S. PATENT DOCUMENTS

| | | | |
|---|---|---|---|
| 2007/0138544 A1* | 6/2007 | Hirler | H01L 29/404 257/330 |
| 2008/0164516 A1 | 7/2008 | Darwish | |
| 2009/0026531 A1 | 1/2009 | Poelzl | |
| 2012/0286355 A1 | 11/2012 | Mauder | |
| 2012/0313161 A1 | 12/2012 | Grivna | |
| 2013/0221428 A1 | 8/2013 | Venkatraman | |
| 2013/0248992 A1 | 9/2013 | Padmanabhan | |
| 2014/0264567 A1 | 9/2014 | Challa | |

* cited by examiner

US 9,711,639 B2

MULTIPLE SHIELDING TRENCH GATE FET

CROSS-REFERENCE TO RELATED APPLICATIONS

Under 35 U.S.C. §120, this continuation application claims priority to and benefits of U.S. patent application Ser. No. 14/706,927 (TI-73841), filed on May 7, 2015, the entirety of which is incorporated herein by reference.

FIELD OF THE DISCLOSURE

This disclosure relates to the field of semiconductor devices. More particularly, this disclosure relates to vertical MOS transistors in semiconductor devices.

BACKGROUND OF THE DISCLOSURE

A vertical metal oxide semiconductor (MOS) transistor with a trench gate in trenches has the gate dielectric layer and gate extending down the trenches past the body, abutting a vertical drift region under the body. The trenches have to be deeper than desired to support a desired operating voltage, because the gate dielectric layer cannot support a high electric field in the drift region. Increasing the thickness of the gate dielectric layer undesirably increases the resistance of the channel region in the on state.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A semiconductor device contains a vertical MOS transistor having a trench gate in trenches. The trenches extend into a substrate of the semiconductor device past a body of the vertical MOS transistor, abutting a drift region of the vertical MOS transistor under the body. The trenches have field plates under the gate; the field plates are adjacent to the drift region and have a plurality of segments. A dielectric liner in the trenches separating the field plates from the drift region has a thickness greater than a gate dielectric layer between the gate and the body. The dielectric liner is thicker on a lower segment of the field plate, at a bottom of the trenches, than an upper segment, immediately under the gate.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device contains a vertical MOS transistor having trenches which extend into a substrate of the semiconductor device. A drain region of the vertical MOS transistor is disposed in the substrate at, or below, bottoms of the trenches. A drift region is disposed in the substrate above the drain region and between the trenches. A body of the vertical MOS transistor is disposed in the substrate, above the drift region and abutting the trenches. A source of the vertical MOS transistor is disposed above the body. A gate of the vertical MOS transistor is disposed in the trenches adjacent to the body, separated from the body by a gate dielectric layer. A field plate with a plurality of segments is disposed in the trenches below the gate, separated from the drift region by a dielectric liner on sidewalls of the trenches. The dielectric liner is thicker on a lower segment of the field plate, at a bottom of the trenches, than an upper segment, immediately under the gate. The field plate segments may be connected to each other or may be electrically isolated from each other. The upper field plate segment may be connected to the gate or may be electrically isolated from the gate. The vertical MOS transistor may be an n-channel MOS transistor or a p-channel MOS transistor.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et al., "Thin Layer High Voltage Devices" Philips J, Res. 35 1-13, 1980.

Figure 1:
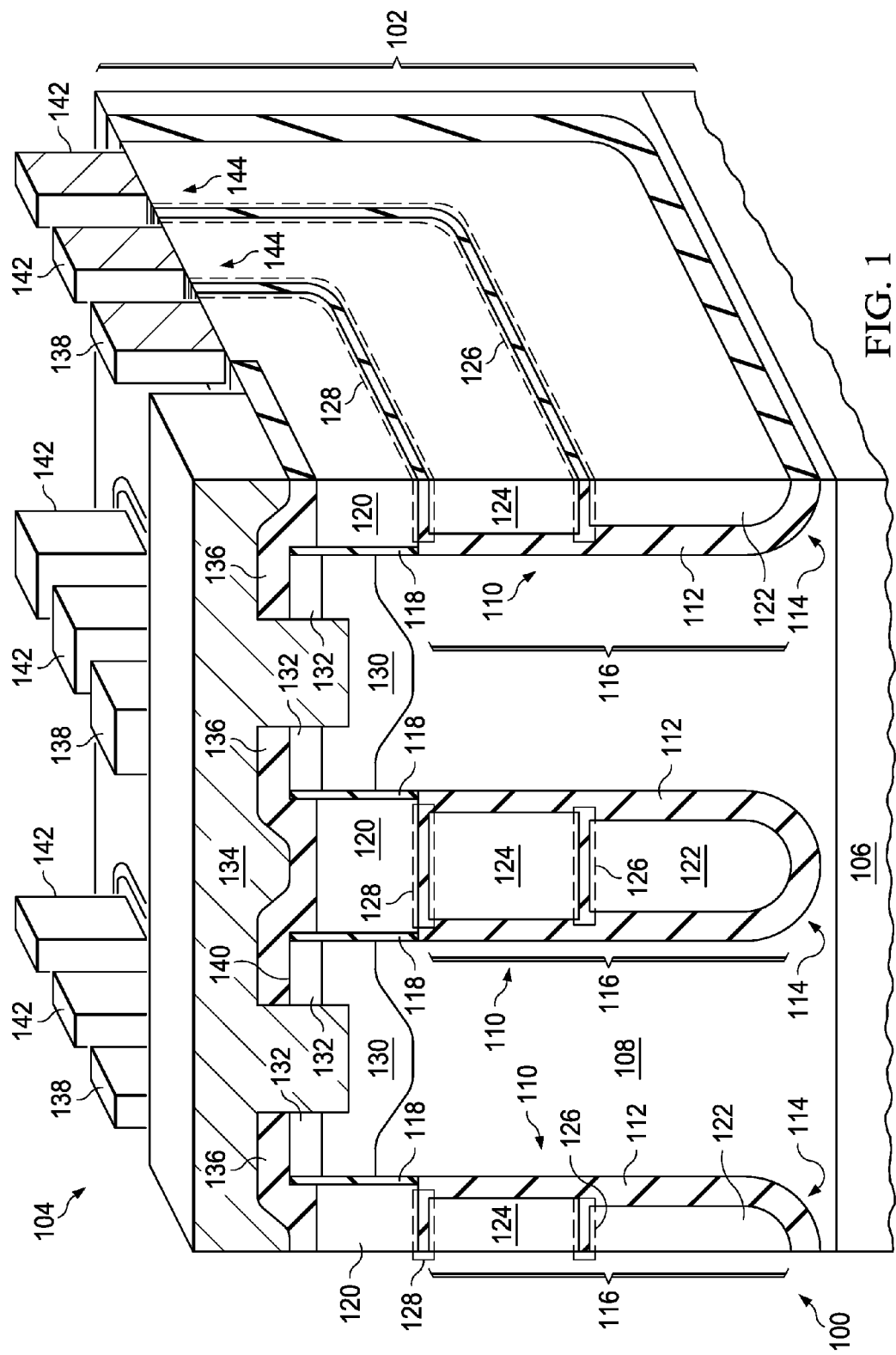
FIG. 1 is a cross section of an example semiconductor device containing a vertical n-channel MOS transistor.

FIG. 1 is a cross section of an example semiconductor device containing a vertical n-channel MOS transistor. The semiconductor device 100 is formed on a substrate 102 which comprises a semiconductor material. The n-channel vertical MOS transistor 104, referred to herein as the transistor 104, may be the only active component of the semiconductor device 100 or may be one of a plurality of active devices in the semiconductor device 100. The transistor 104 includes an n-type drain region 106 disposed in the substrate 102 below an n-type vertical drift region 108.

The semiconductor device 100 includes trenches 110 which extend vertically through the vertical drift region 108 proximate to the drain region 106 as depicted in FIG. 1, or possibly into the drain region 106. The trenches 110 contain a dielectric liner 112 on sidewalls of the trenches 110 extending to bottoms 114 of the trenches 110 and abutting the substrate 102, and a plurality of field plate segments 116 on the dielectric liner 112. The trenches 110 further contain a gate dielectric layer 118 above the dielectric liner 112 abutting the substrate 102, and a trench gate 120 of the transistor 104 contacting the gate dielectric layer 118. In the instant example, the plurality of field plate segments 116 includes a lower field plate segment 122 on the dielectric liner 112 at the bottoms 114 of the trenches 110, and an upper field plate segment 124 disposed above the lower field plate segment 122. The plurality of field plate segments 116 and the trench gate 120 may include primarily polycrystalline silicon, referred to as polysilicon. The dielectric liner 112 may include primarily silicon dioxide. The dielectric liner 112 separates the lower field plate segment 122 and the upper field plate segment 124 from the substrate 102. The dielectric liner 112 disposed on the sidewalls of the trenches 110 between the lower field plate segment 122 and the substrate 102 is thicker than the dielectric liner 112 disposed on the sidewalls of the trenches 110 between the upper field plate segment 124 and the substrate 102. The dielectric liner 112 disposed on the sidewalls of the trenches 110 between the upper field plate segment 124 and the substrate 102 is thicker than the gate dielectric layer 118 disposed on the sidewalls of the trenches 110 between the trench gate 120 and the substrate 102. For example, in a version of the instant example in which the transistor 104 is designed to operate up to 250 volts, the dielectric liner 112 disposed on the sidewalls of the trenches 110 between the lower field plate segment 122 and the substrate 102 may be 900 nanometers to 1000 nanometers thick, and the dielectric liner 112 disposed on the sidewalls of the trenches 110 between the upper field plate segment 124 and the substrate 102 may be 300 nanometers to 400 nanometers thick.

In the instant example, the lower field plate segment 122 is electrically isolated from the upper field plate segment 124 by a first isolation layer 126, disposed between the lower field plate segment 122 and the upper field plate segment 124. Also in the instant example, the upper field plate segment 124 is electrically isolated from the trench gate 120 by a second isolation layer 128, disposed between the upper field plate segment 124 and the trench gate 120. The first isolation layer 126 and the second isolation layer 128 include dielectric material such as silicon dioxide, and may have a similar composition as the dielectric liner 112.

The transistor 104 includes a p-type body 130 in the substrate 102 above the vertical drift region 108, abutting the gate dielectric layer 118. The transistor 104 further includes an n-type source 132 above the body 130 and abutting the gate dielectric layer 118. The trench gate 120 is partially coextensive with the vertical drift region 108 and the source 132. A source electrode 134 is disposed over the substrate 102 making electrical contact to the source 132 and the body 130. The source electrode 134 is electrically isolated from the trench gate 120 by a dielectric cap layer 136 over the trench gate 120.

In a version of the instant example, in which the transistor 104 is designed to operate up to 250 volts, the trenches 110 may be 13 microns to 17 microns deep and 2.5 microns to 2.8 microns wide. The vertical drift region 108 may be 0.5 microns to 3 microns wide, that is, between adjacent trenches 110, and have an average doping density of $1.4 \times 10^{16}$ cm$^{-3}$ to $1.6 \times 10^{16}$ cm$^{-3}$.

Electrical connection to the trench gate 120 may be made through gate contacts 138 on exposed areas of the gate at a top surface 140 of the substrate 102. Electrical connections to the plurality of field plate segments 116 may be made through field plate contacts 142 on field plate risers 144 which extend from the plurality of field plate segments 116 up to the top surface 140 of the substrate 102. Other structures for making electrical connections to the plurality of field plate segments 116 are within the scope of the instant example.

During operation of the semiconductor device 100, the trench gate 120 being disposed in the trenches 110 advantageously provides a higher on-state current in the area of the top surface 140 occupied by the transistor 104 compared to a similar vertical MOS transistor with a planar gate. A combination of the upper field plate segment 124 and the lower field plate segment 122 provide a RESURF configuration to maintain an electric field in the vertical drift region 108 at a desired value with a higher doping density in the vertical drift region 108 compared to a similar vertical MOS transistor with a single field plate. Hence forming the vertical MOS transistor 104 with the combination of the upper field plate segment 124 and the lower field plate segment 122 enables the transistor 104 to have shallower trenches 110 than the similar vertical MOS transistor with a single field plate, advantageously reducing a fabrication cost of the semiconductor device 100. Forming the lower field plate segment 122, the upper field plate segment 124 and the trench gate 120 to be electrically isolated from each other may advantageously enable biasing the lower field plate segment 122 and the upper field plate segment 124 independently so as to increase current density in the transistor 104.

Figure 2A:
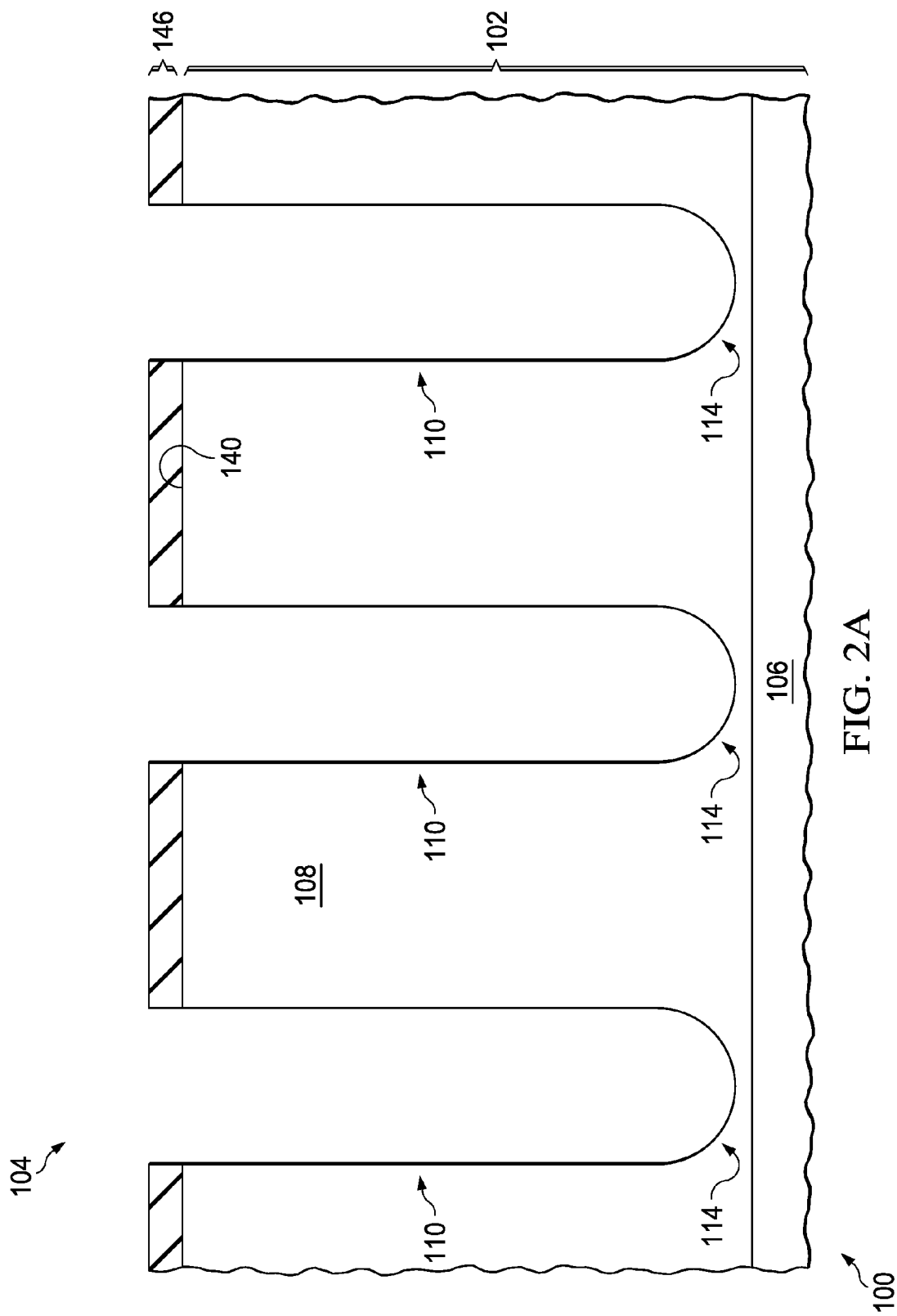
FIG. 2A through FIG. 2K are cross sections of the semiconductor device of FIG. 1, depicted in successive stages of fabrication.

FIG. 2A through FIG. 2K are cross sections of the semiconductor device of FIG. 1, depicted in successive stages of fabrication. Referring to FIG. 2A, the semiconductor device 100 is formed on the substrate 102 which may be, for example a bulk silicon wafer or a silicon wafer with an epitaxial layer extending to the top surface 140. Other semiconductor materials in the substrate 102 are within the scope of the instant example. The drain region 106 is formed in the substrate 102 to have a doping density greater than $1 \times 10^{20}$ cm$^{-3}$. The drain region 106 may be formed, for example, by implanting n-type dopants such as antimony and possibly arsenic into the substrate 102 followed by an anneal and epitaxial growth of n-type semiconductor material over the implanted n-type dopants, so that the epitaxial layer provides the vertical drift region 108. N-type dopants such as phosphorus in the vertical drift region 108 may be incorporated during epitaxial growth or may be implanted later, followed by a thermal drive to diffuse and activate the implanted dopants.

A hard mask 146 is formed over the substrate 102 which exposes areas for the trenches 110. The hard mask 146 may be several hundred nanometers of silicon dioxide, and may be patterned by etching through a photoresist mask. The trenches 110 are formed by removing material from the substrate 102 in the areas exposed by the hard mask 146. The material may be removed from the substrate 102 by a timed reactive ion etch (RIE) process to attain a desired depth of the trenches 110.

Figure 2B:
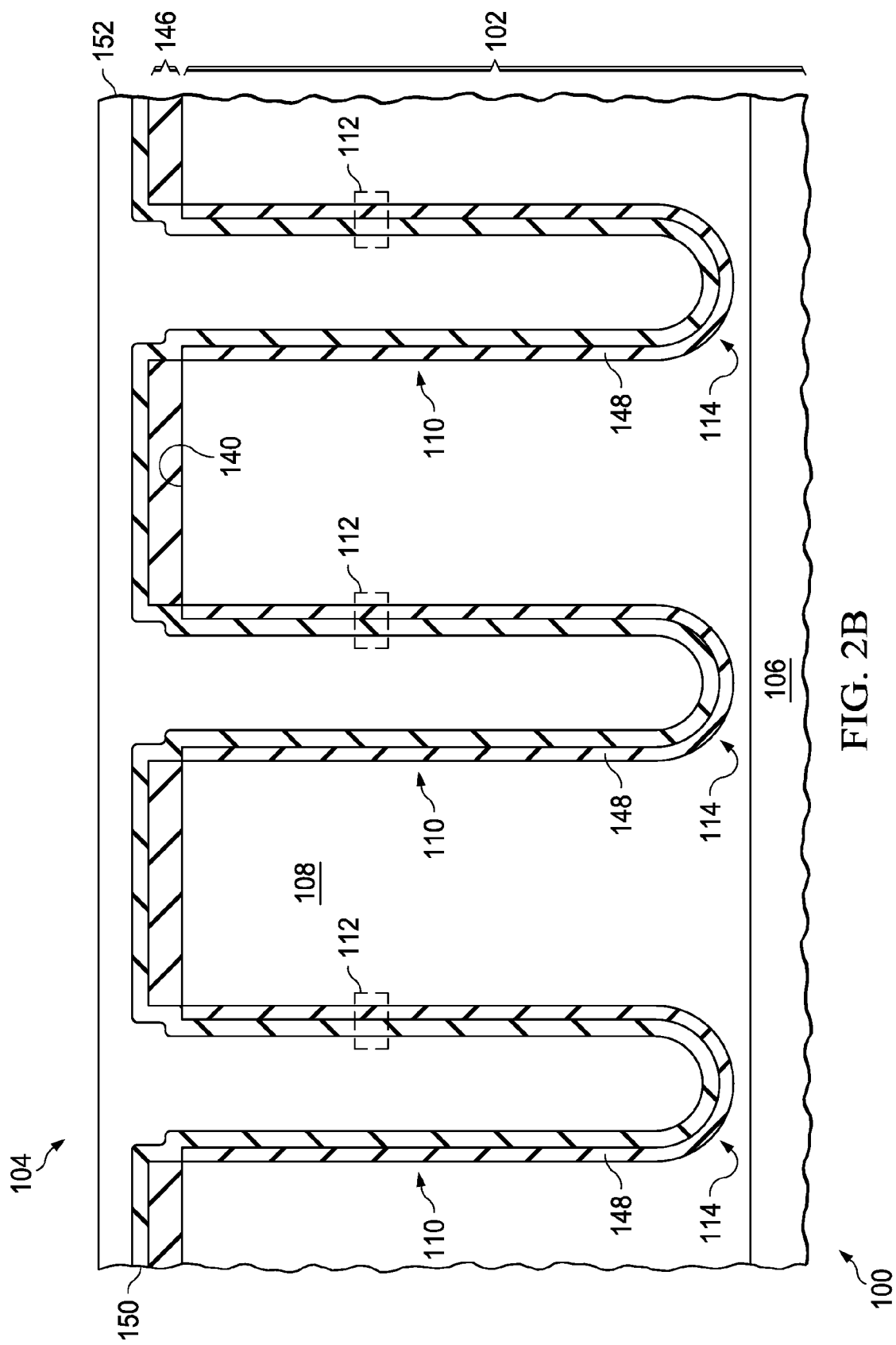

Referring to FIG. 2B, the dielectric liner 112 abutting the lower field plate segment 122 of FIG. 1 may be formed as a combined layer of a thermal oxide layer 148 and a first deposited silicon dioxide layer 150. The thermal oxide layer 148 is formed at sidewalls and bottoms 114 of the trenches 110. The thermal oxide layer 148 may be 50 nanometers to 200 nanometers thick. The first deposited silicon dioxide layer 150 is formed on the thermal oxide layer 148. The first deposited silicon dioxide layer 150 may be 200 nanometers to 400 nanometers thick, and may be formed by a sub-atmospheric chemical vapor deposition (SACVD) process using dichlorosilane and oxygen. Alternately, the first deposited silicon dioxide layer 150 may be formed by a plasma enhanced chemical vapor deposition (PECVD) process using tetraethyl orthosilicate, also known as tetraethoxysilane or TEOS. The first deposited silicon dioxide layer 150 may be subsequently densified in an anneal step. Other layer structures and other processes for the dielectric liner 112 are within the scope of the instant example.

A first polysilicon layer 152 is formed on the dielectric liner 112 and extending over the top surface 140 of the substrate 102. The first polysilicon layer 152 may be for example, 500 nanometers to 700 nanometers thick over the top surface 140. The first polysilicon layer 152 may be doped, for example with phosphorus, during formation to have an average doping density of $1 \times 10^{18}$ cm$^{-3}$ to $5 \times 10^{18}$ cm$^{-3}$. Alternatively, the first polysilicon layer 152 may be doped by ion implanting dopants, for example phosphorus, at a dose of $1 \times 10^{14}$ cm$^{-2}$ to $5 \times 10^{15}$ cm$^{-2}$, and subsequent annealed at 900° C. to 1000° C. for 10 to 60 minutes.

Figure 2C:
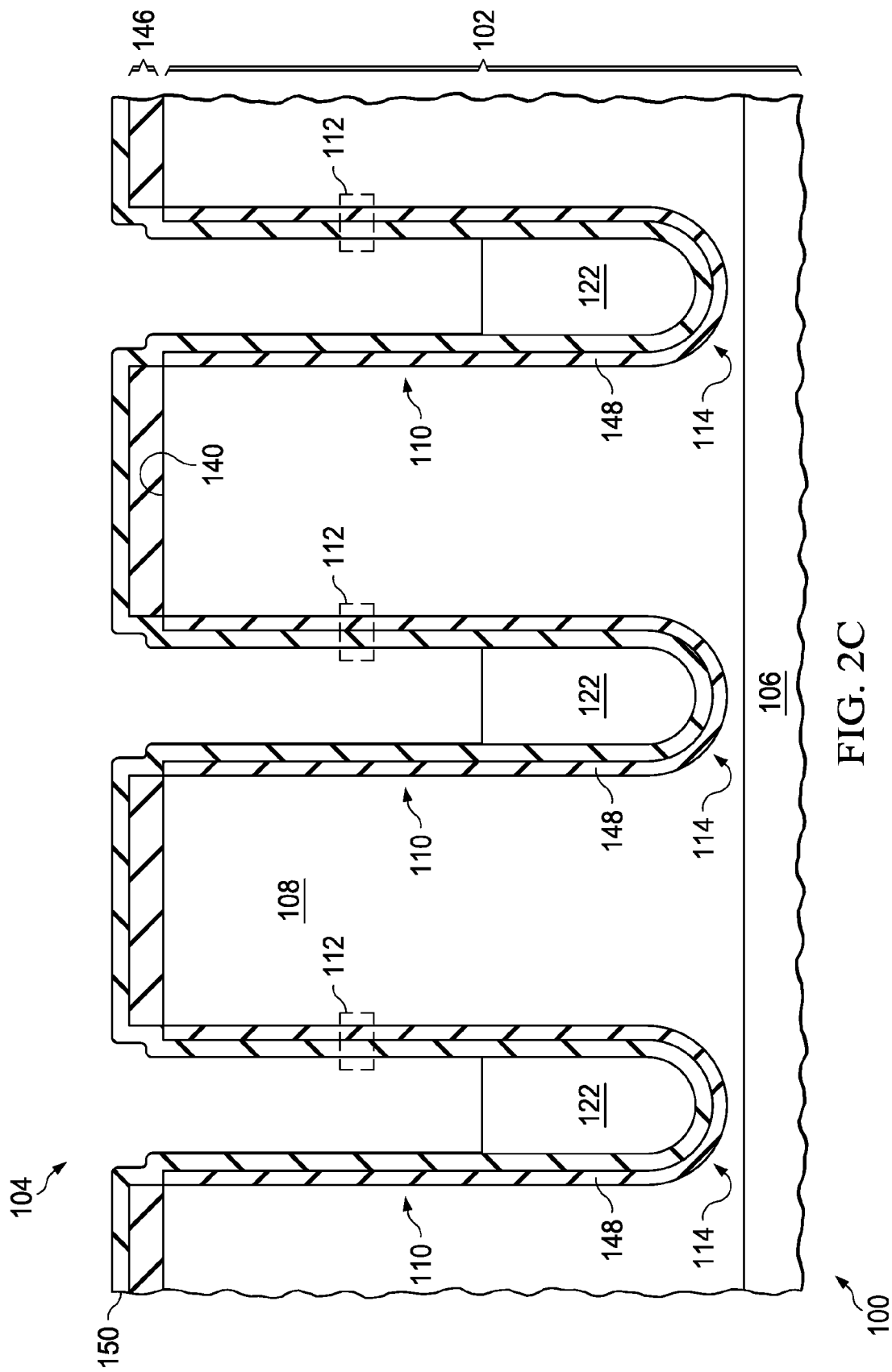

Referring to FIG. 2C, a blanket etchback process removes polysilicon from the first polysilicon layer 152 of FIG. 2B over the top surface 140 and in the trenches 110, leaving polysilicon in the lower portions of the trenches 110 to form the lower field plate segment 122. The blanket etchback may be performed, for example, using a timed plasma etch including fluorine radicals and/or a timed wet etch using choline, ammonium hydroxide or tetramethyl ammonium hydroxide. The blanket etchback may be performed in one or more etch steps. In one version of the instant example, the blanket etchback does not remove a significant amount of the dielectric liner 112.

Figure 2D:
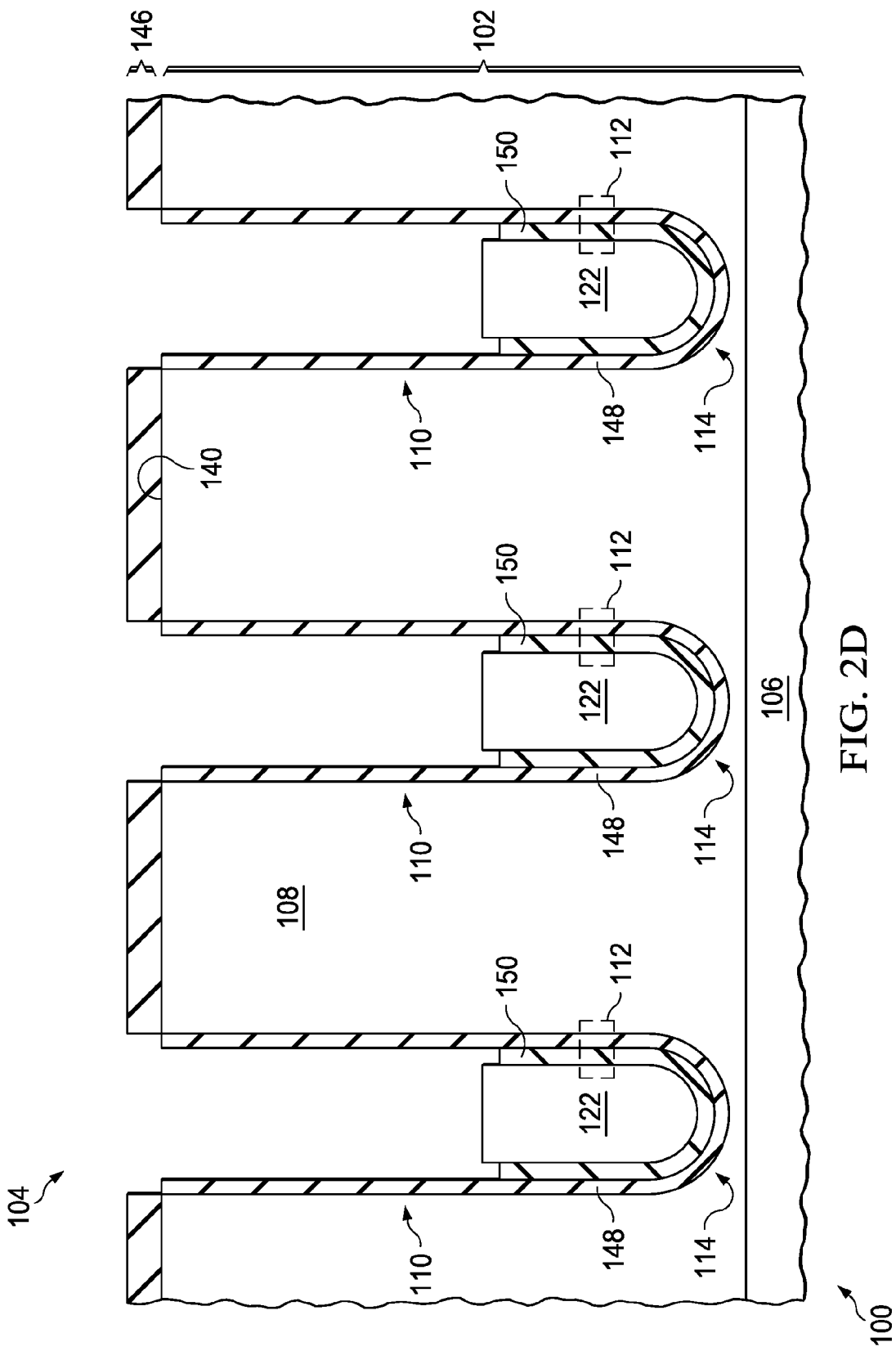

Referring to FIG. 2D, a first blanket oxide etchback process removes at least portion, and possibly all, of the first deposited silicon dioxide layer 150 from over the top surface 140 of the substrate 102 and from the trenches 110 above the lower field plate segment 122. The lower field plate segment 122 prevents removal of the first deposited silicon dioxide layer 150 from the trenches 110 below a top of the lower field plate segment 122. A majority, and possibly all, of the thermal oxide layer 148 remains on sidewalls of the trenches 110 after the first blanket oxide etchback process is completed. The first blanket oxide etchback process may include, for example, a timed wet etch using a buffered hydrofluoric acid solution. An example buffered hydrofluoric acid solution is 10 parts of 40 percent ammonium fluoride in deionized water and 1 part of 49 percent hydrofluoric acid in deionized water; this buffered hydrofluoric acid exhibits an etch rate of densified SACVD silicon dioxide that is more than twice an etch rate of thermal oxide.

Figure 2E:
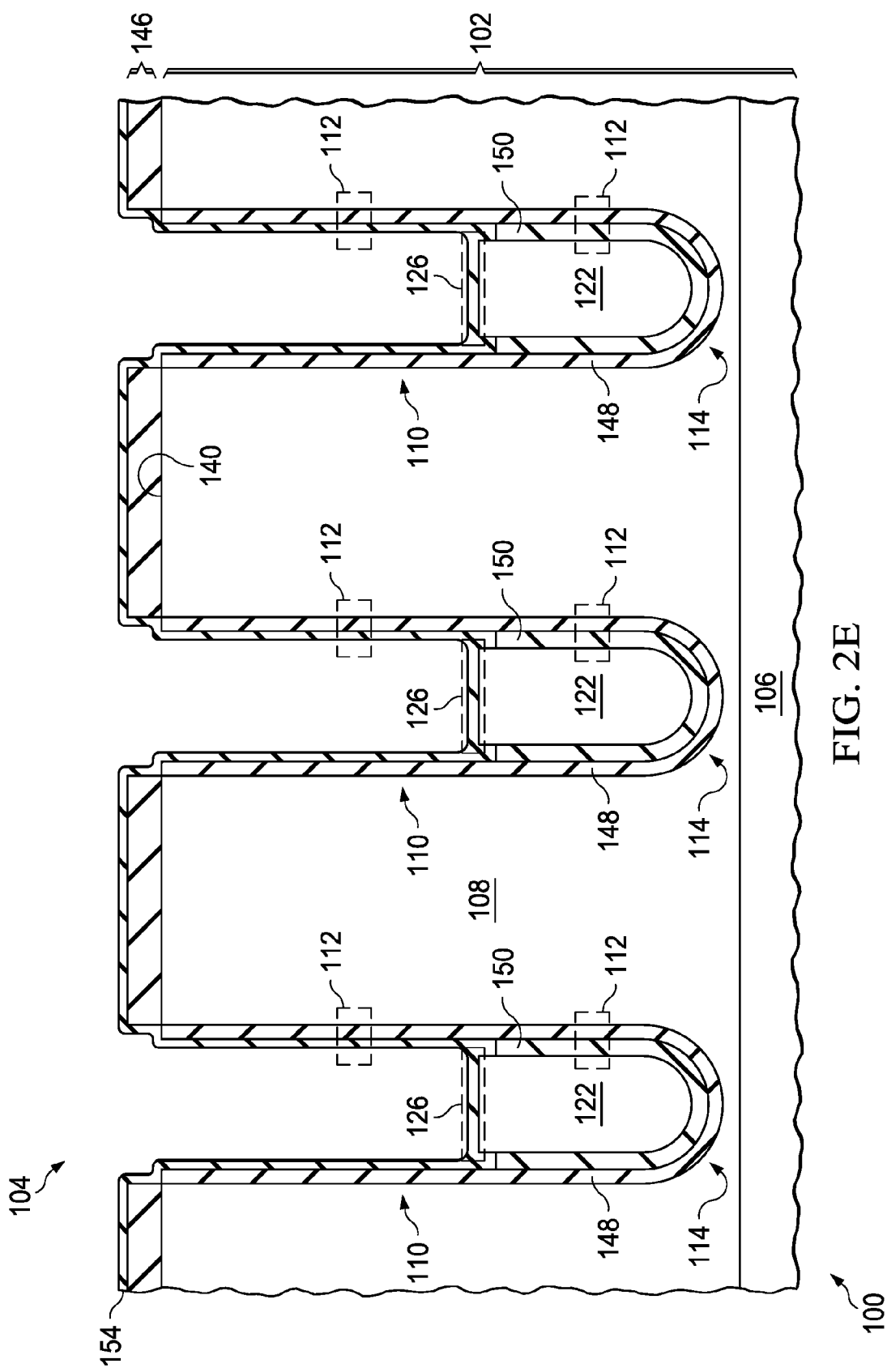

Referring to FIG. 2E, a second deposited silicon dioxide layer 154 is formed over the thermal oxide layer 148 in the trenches 110 and over the lower field plate segment 122. The second deposited silicon dioxide layer 154 may be, for example, 160 nanometers to 280 nanometers thick, and may be formed by an SACVD process or a PECVD process. The second deposited silicon dioxide layer 154 may be subsequently densified in an anneal step. The second deposited silicon dioxide layer 154 combined with the thermal oxide layer 148 provide the dielectric liner 112 abutting the upper field plate segment 124 of FIG. 1. A portion of the second deposited silicon dioxide layer 154 on the lower field plate segment 122 provides the first isolation layer 126.

Figure 2F:
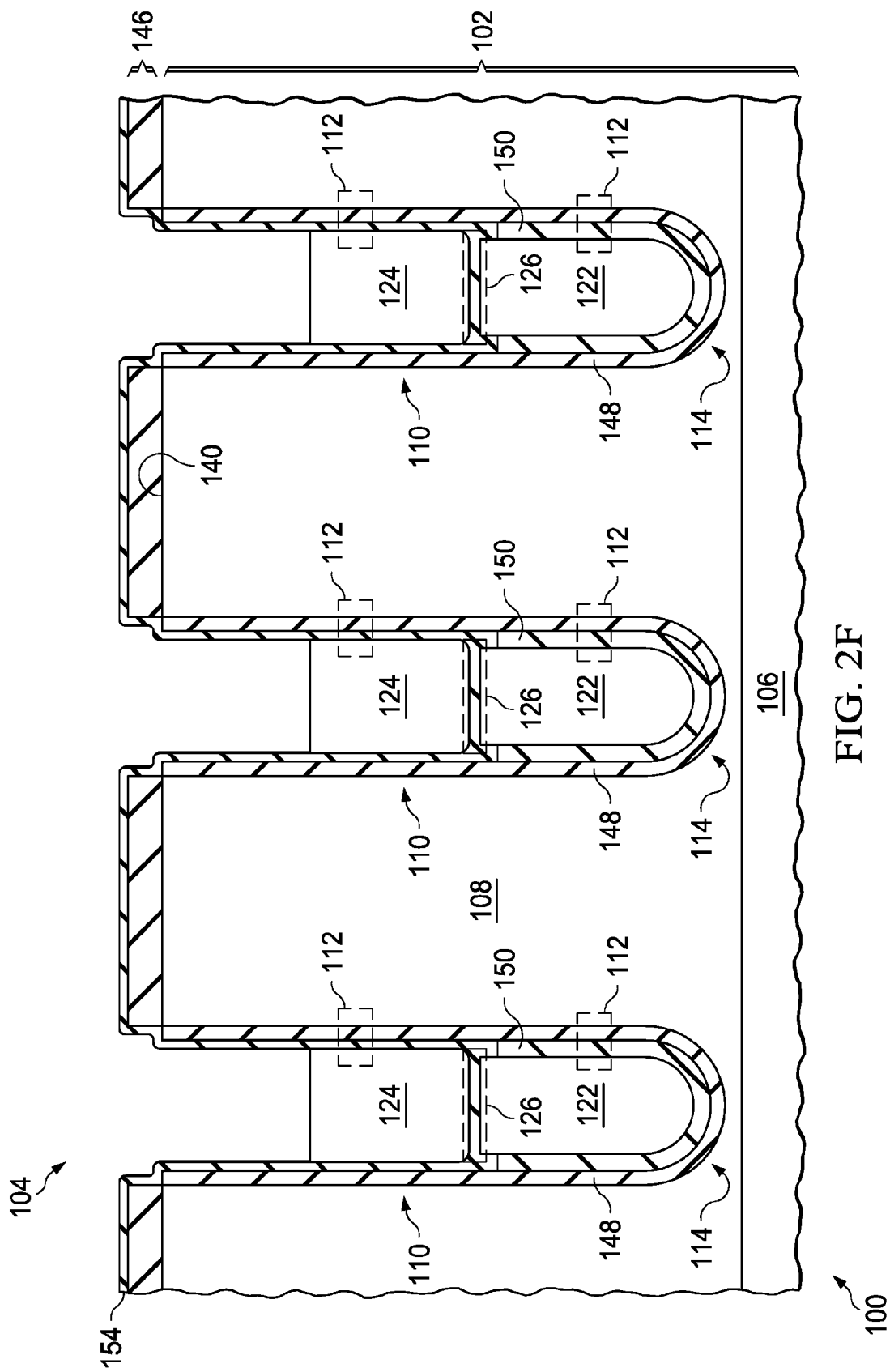

Referring to FIG. 2F, a second polysilicon layer is formed on the dielectric liner 112 in the trenches 110 and over the top surface 140 of the substrate 102, for example as described in reference to FIG. 2B. A subsequent etchback process removes the polysilicon from over the top surface 140 and from a top portion of the trenches 110, leaving polysilicon on the second deposited silicon dioxide layer 154 to form the upper field plate segment 124. The etchback process may be a timed plasma etch and/or a timed wet etch, for example as described in reference to FIG. 2C. In the instant example, the upper field plate segment 124 is electrically isolated from the lower field plate segment 122 by the second deposited silicon dioxide layer 154.

Figure 2G:
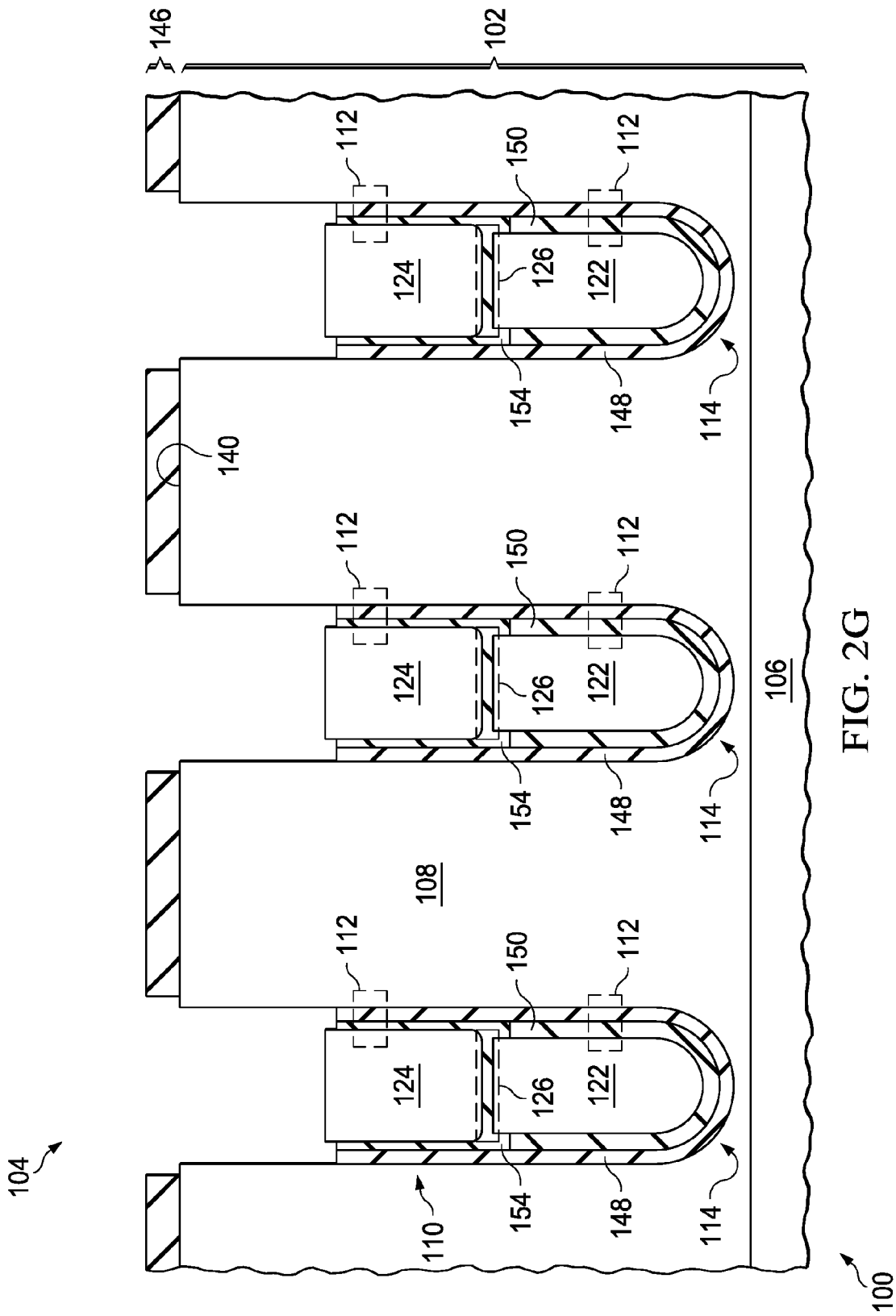

Referring to FIG. 2G, a second blanket oxide etchback process removes the second deposited silicon dioxide layer 154 and the thermal oxide layer 148 from over the top surface 140 of the substrate 102 and from the trenches 110 above the upper field plate segment 124. The upper field plate segment 124 prevents removal of the second deposited silicon dioxide layer 154 from the trenches 110 below a top of the upper field plate segment 124. A portion of the hard mask 146 may be removed by the second blanket oxide etchback process, as depicted in FIG. 2G. The second blanket oxide etchback process may be performed so that substantially no semiconductor material is removed from the substrate 102.

Figure 2H:
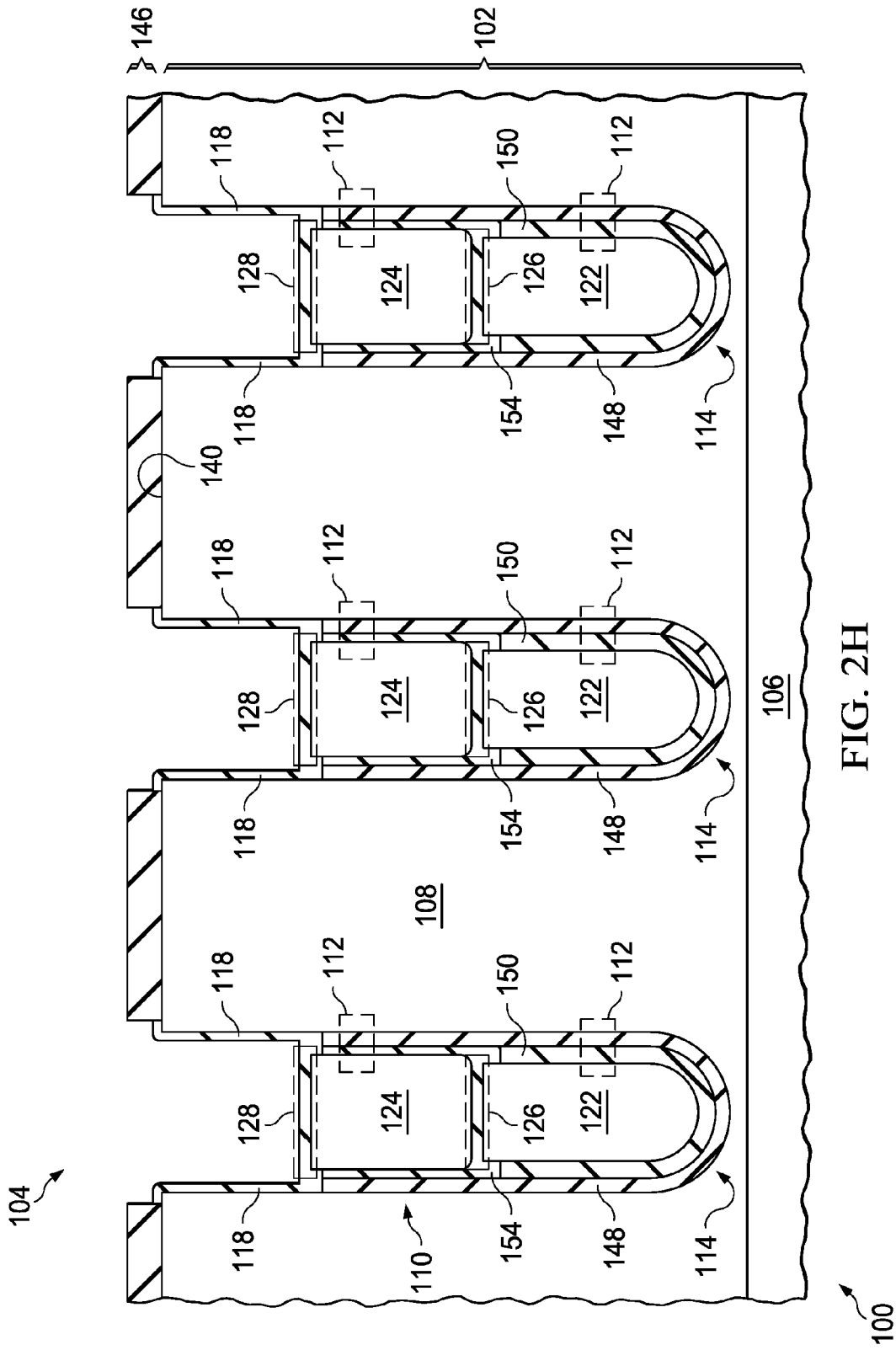

Referring to FIG. 2H, the gate dielectric layer 118 is formed on sidewalls of the trenches 110 above the upper field plate segment 124, and the second isolation layer 128 are concurrently formed on the upper field plate segment 124. The gate dielectric layer 118 and the second isolation layer 128 may be formed by thermal oxidation, or a combination of thermal oxidation and deposition of dielectric material. Removing the thermal oxide layer 148 so as to expose the sidewalls of the trenches 110 advantageously improves process control of a thickness of the gate dielectric layer 118.

Figure 2I:
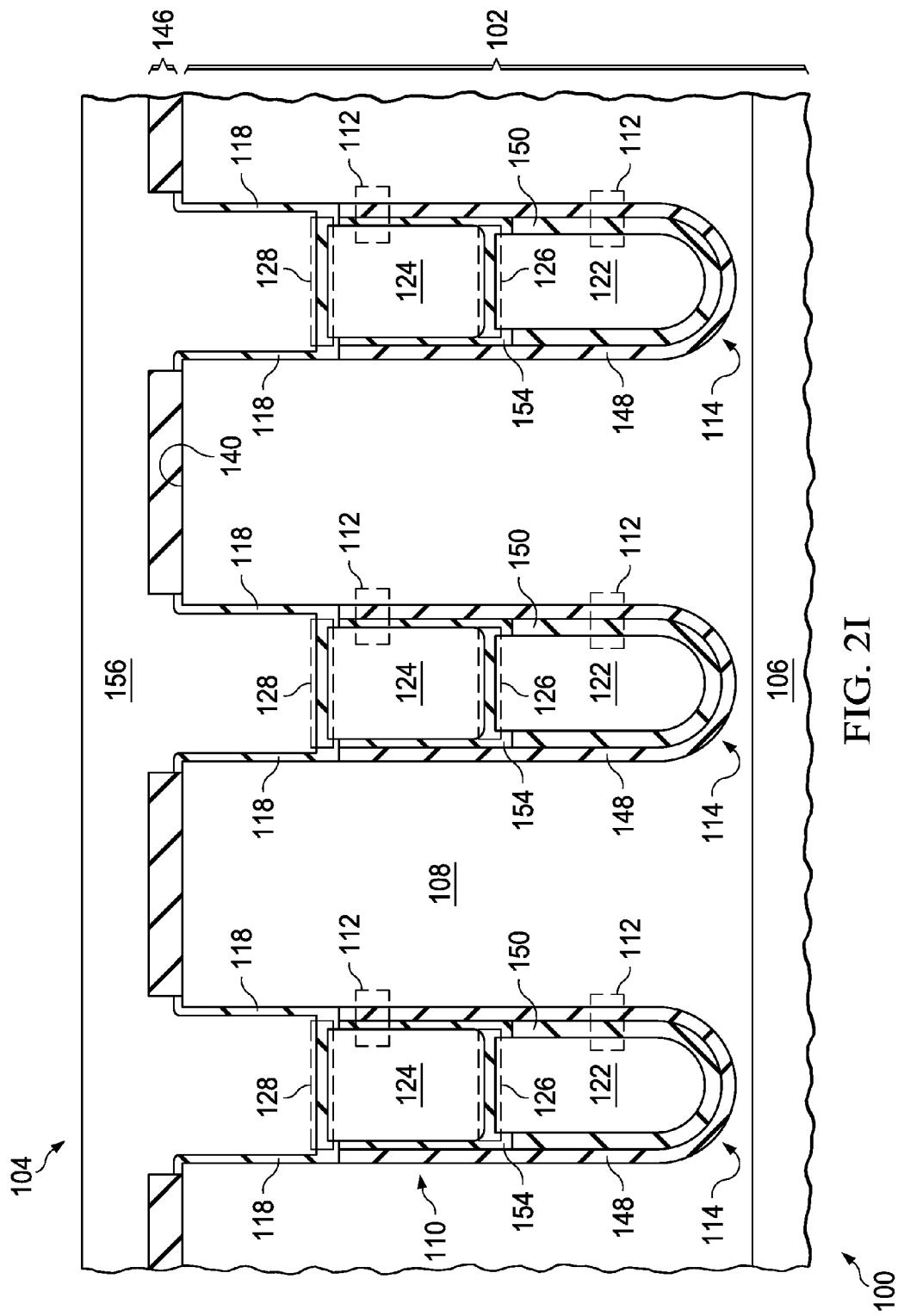

Referring to FIG. 2I, a third layer pf polysilicon 156 is formed contacting the gate dielectric layer 118 and over the top surface 140 of the substrate 102. The third layer of polysilicon 156 may be doped with n-type dopants during formation, or may be subsequently implanted with n-type dopants, followed by an anneal.

Figure 2J:
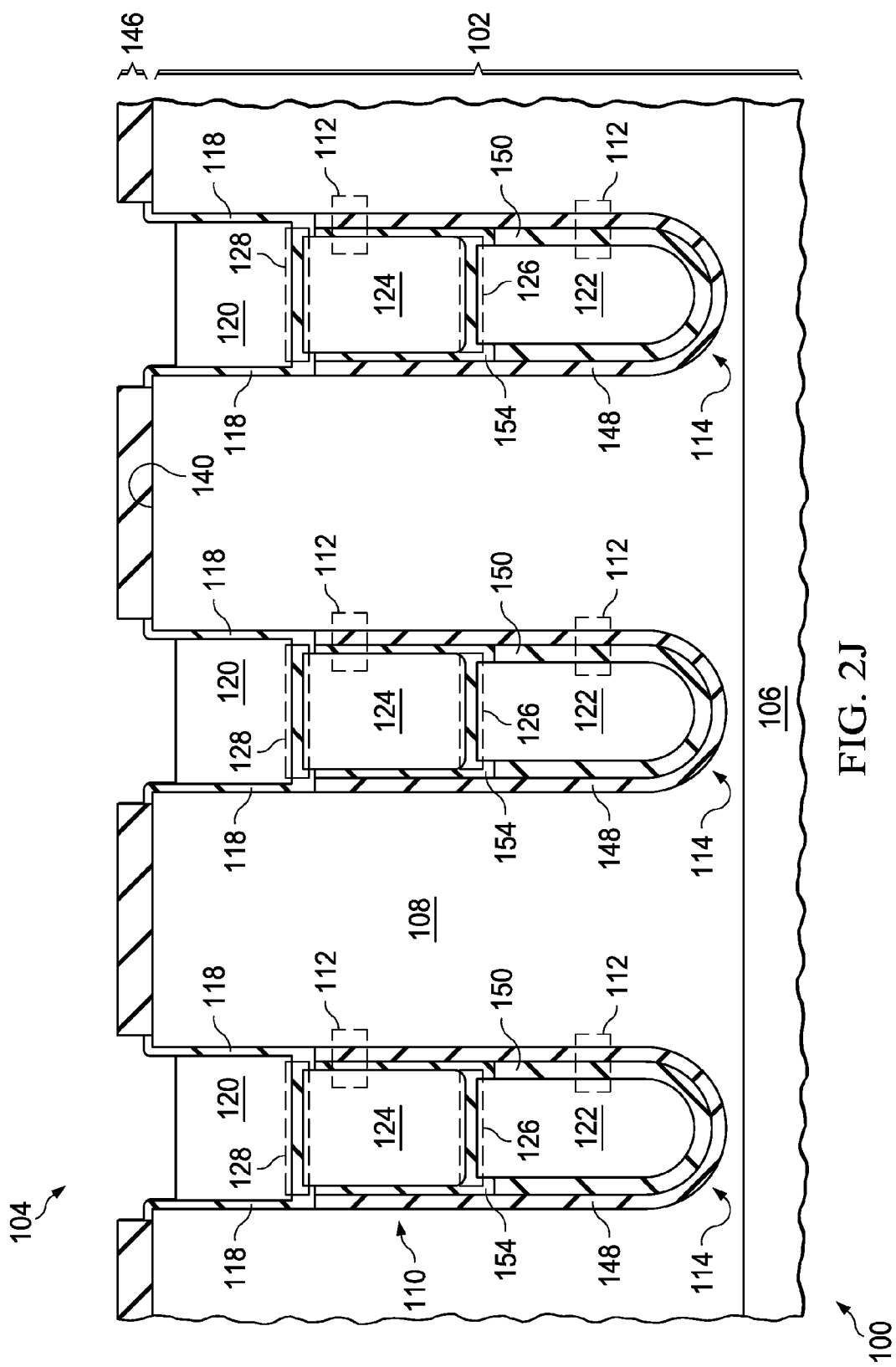

Referring to FIG. 2J, a blanket etchback process removes polysilicon from the third layer pf polysilicon 156 of FIG. 2I from over the top surface 140 of the substrate 102 to leave polysilicon contacting the gate dielectric layer 118 to form the trench gate 120 of the transistor 104. In the instant example, the trench gate 120 is electrically isolated from the upper field plate segment 124 by the second isolation layer 128.

Figure 2K:
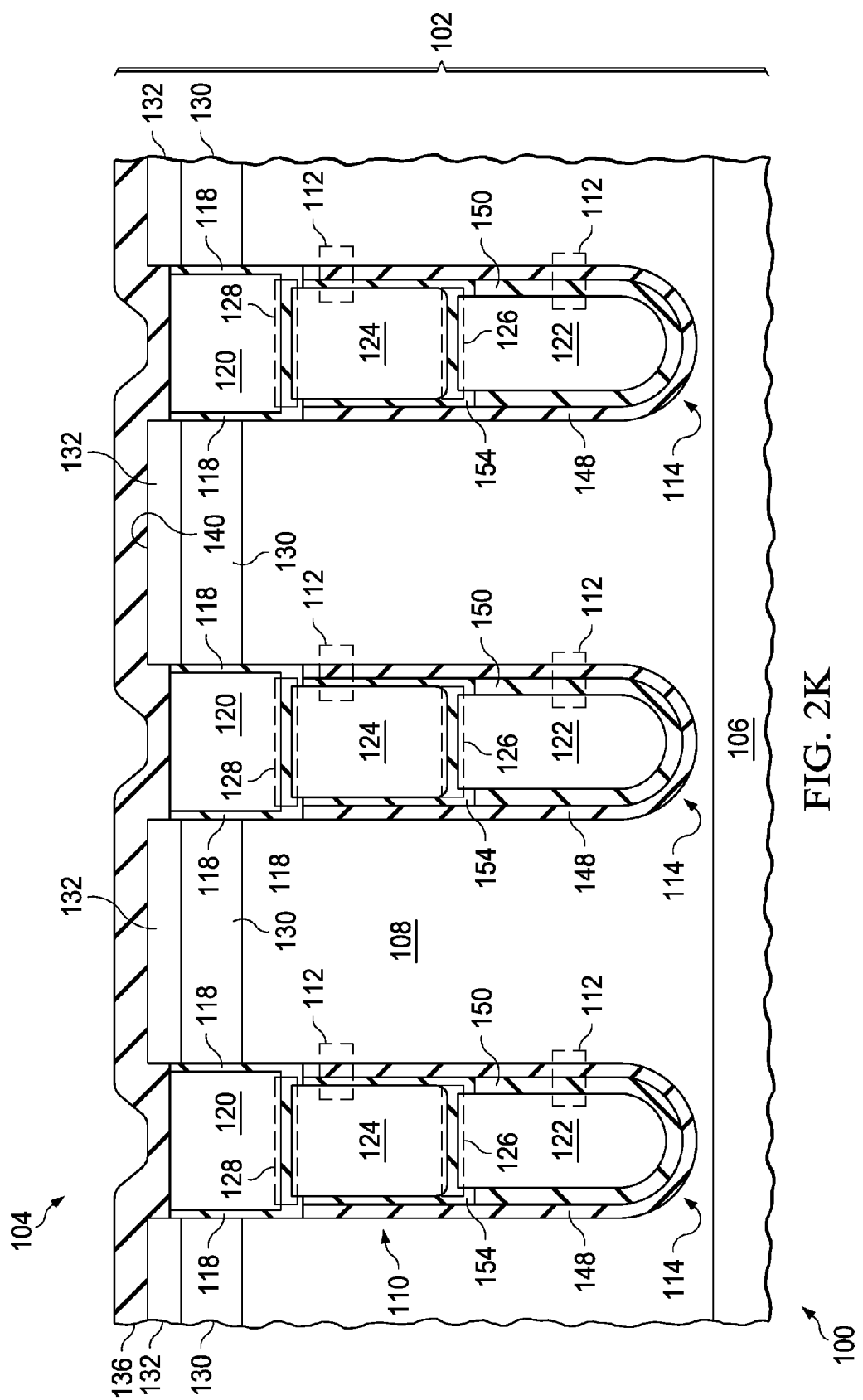

Referring to FIG. 2K, the body 130 is formed by implanting p-type dopants such as boron into the substrate 102 above the vertical drift region 108. The trench gate 120 may optionally be covered by an implant mask while the p-type dopants are implanted, to prevent counterdoping the trench gate 120. The source 132 is formed by implanting n-type dopants such as phosphorus and arsenic into the substrate 102 above the body 130. The substrate 102 is subsequently annealed to activate the implanted dopants. The body 130 and source 132 extend across the substrate 102 between adjacent trenches 110. After the body 130 and the source 132 are formed, the cap layer 136 is formed by deposition of silicon dioxide and optionally a sub-layer of silicon nitride.

The cap layer 136 may be formed by a PECVD process using TEOS. After the cap layer 136 is formed, source contact opening are formed through the cap layer 136 and through the source 132 into the body 130. Additional p-type dopants may be implanted into the body 130 where exposed by the source contact openings, which provides the downward bulge in the body depicted in FIG. 1. The source electrode 134 of FIG. 1 is subsequently formed, and further fabrication provides the structure of FIG. 1.

Figure 3:
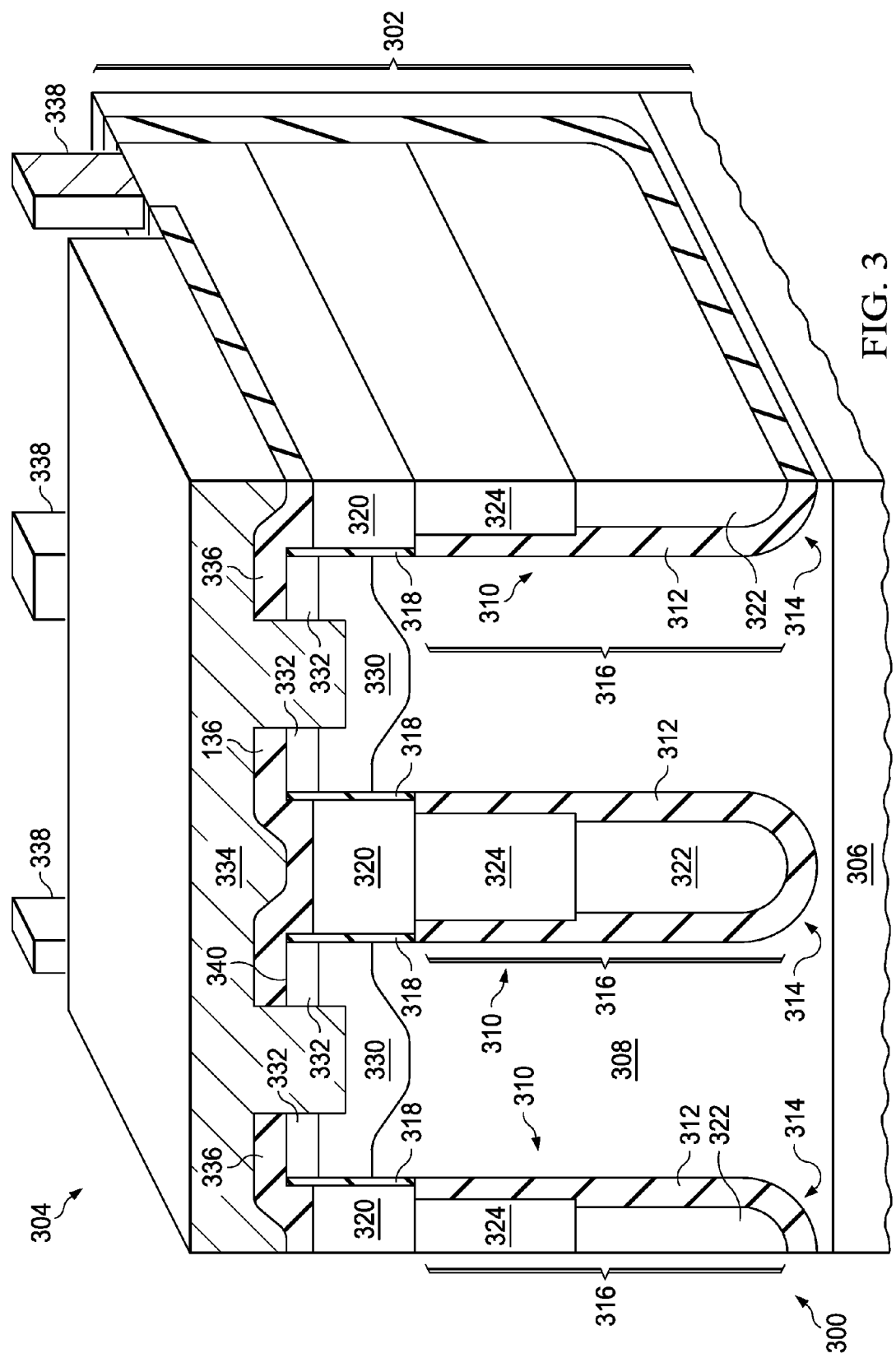
FIG. 3 is a cross section of another example semiconductor device containing a vertical n-channel MOS transistor.

FIG. 3 is a cross section of another example semiconductor device containing a vertical n-channel MOS transistor. The semiconductor device 300 is formed on a substrate 302 which comprises a semiconductor material. The n-channel vertical MOS transistor 304, referred to herein as the transistor 304, includes an n-type drain region 306 disposed in the substrate 302 below an n-type vertical drift region 308.

The semiconductor device 300 includes trenches 310 which extend vertically through the vertical drift region 308 proximate to the drain region 306, or possibly into the drain region 306. The trenches 310 contain a dielectric liner 312 extending to bottoms 314 of the trenches 310 and abutting the substrate 302, and a plurality of field plate segments 316 on the dielectric liner 312. The trenches 310 further contain a gate dielectric layer 318 above the dielectric liner 312 abutting the substrate 302, and a trench gate 320 of the transistor 304 contacting the gate dielectric layer 318. In the instant example, the plurality of field plate segments 316 includes a lower field plate segment 322 on the dielectric liner 312 at the bottoms 314 of the trenches 310, and an upper field plate segment 324 disposed above the lower field plate segment 322. The plurality of field plate segments 316 and the trench gate 320 may include primarily n-type polysilicon. The dielectric liner 312 may include primarily silicon dioxide. The dielectric liner 312 separates the lower field plate segment 322 and the upper field plate segment 324 from the substrate 302. The dielectric liner 312 separating the lower field plate segment 322 from the substrate 302 is thicker than the dielectric liner 312 separating the upper field plate segment 324 from the substrate 302. The dielectric liner 312 disposed on the sidewalls of the trenches 310 between the upper field plate segment 324 and the substrate 302 is thicker than the gate dielectric layer 318 disposed on the sidewalls of the trenches 310 between the trench gate 320 and the substrate 302. For example, in a version of the instant example in which the transistor 304 is designed to operate up to 40 volts, the dielectric liner 312 disposed on the sidewalls of the trenches 310 between the lower field plate segment 322 and the substrate 302 may be 100 nanometers to 150 nanometers thick, and the dielectric liner 312 disposed on the sidewalls of the trenches 310 between the upper field plate segment 324 and the substrate 302 may be 50 nanometers to 80 nanometers thick.

In the instant example, the lower field plate segment 322 is contacting the upper field plate segment 324 in the trenches 310. The upper field plate segment 324 is contacting the trench gate 320 in the trenches 310. A bias voltage applied to the trench gate 320 in the instant example also biases the upper field plate segment 324 and the lower field plate segment 322 to the same bias voltage.

The transistor 304 include a p-type body 330 in the substrate 302 above the vertical drift region 308, abutting the gate dielectric layer 318. The transistor 304 further includes an n-type source 332 above the body 330 and abutting the gate dielectric layer 318. The trench gate 320 is partially coextensive with the vertical drift region 308 and the source 332. A source electrode 334 is disposed over the substrate 302 making electrical contact to the source 332 and the body 330. The source electrode 334 is electrically isolated from the trench gate 320 by a dielectric cap layer 336 over the trench gate 320. Other configurations for the source electrode 334 with respect to the source 332 and body 330 are within the scope of the instant example.

In one version of the instant example, in which the transistor 304 is designed to operate up to 40 volts, the trenches 310 may be 2.2 microns to 2.8 microns deep and 600 nanometers to 700 nanometers wide. The vertical drift region 308 may be 500 nanometers to 1.5 microns wide, that is, between adjacent trenches 310, and have an average doping density of $1.8 \times 10^{16}$ cm$^{-3}$ to $2.0 \times 10^{16}$ cm$^{-3}$.

Electrical connection to the trench gate 320 may be made through gate contacts 338 on exposed areas of the gate at a top surface 340 of the substrate 302. Other structures for making electrical connections to the trench gate 320 are within the scope of the instant example. Forming the upper field plate segment 324 to contact the trench gate 320 in the trenches 310, and forming the lower field plate segment 322 to contact the upper field plate segment 324 in the trenches 310, so that electrical connections to the upper field plate segment 324 and the lower field plate segment 322 may be made through the gate contacts 338 may advantageously reduce complexity and fabrication cost of the semiconductor device 300.

During operation of the semiconductor device 300, the trench gate 320 advantageously provides higher current density as explained in reference to FIG. 1. The plurality of field plate segments 316 provides a RESURF configuration to maintain an electric field in the vertical drift region 308 at a desired value, as explained in reference to FIG. 1. Hence forming the vertical MOS transistor 304 with the combination of the upper field plate segment 324 and the lower field plate segment 322 enables the transistor 304 to have shallower trenches 310 than the similar vertical MOS transistor with a single field plate, advantageously reducing a fabrication cost of the semiconductor device 300.

Figure 4A:
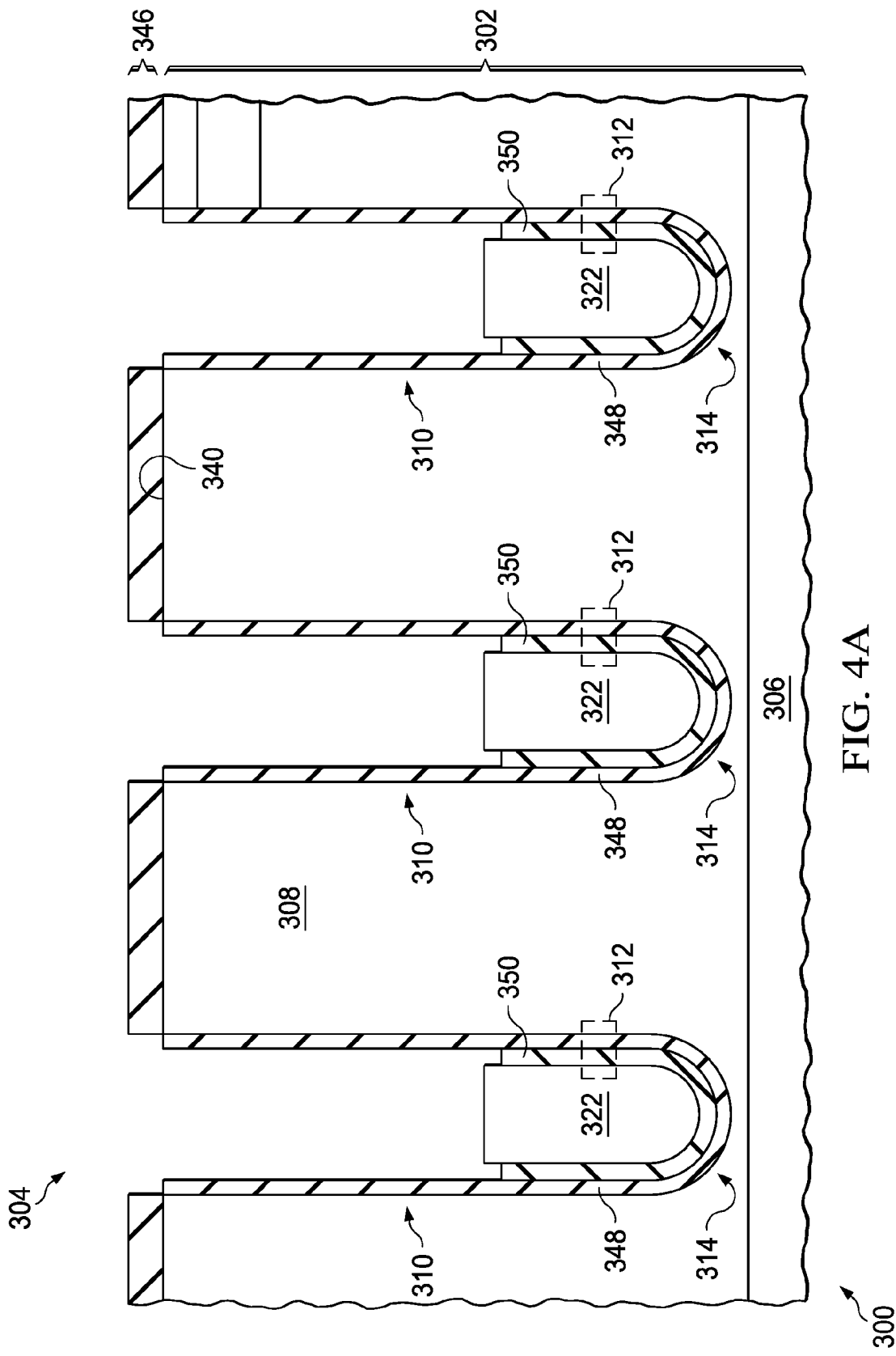
FIG. 4A through FIG. 4E are cross sections of the semiconductor device of FIG. 3, depicted in successive stages of fabrication.

FIG. 4A through FIG. 4E are cross sections of the semiconductor device of FIG. 3, depicted in successive stages of fabrication. Referring to FIG. 4A, the semiconductor device 300 is formed on the substrate 302. The drain region 306 is formed in the substrate 302 to have a doping density greater than $1 \times 10^{20}$ cm$^{-3}$. N-type dopants such as phosphorus in the vertical drift region 308 may be incorporated during epitaxial growth or may be implanted later. A hard mask 346 is formed over the substrate 302 which exposes areas for the trenches 310. The trenches 310 are formed by removing material from the substrate 302 in the areas exposed by the hard mask 346. The drain region 306, hard mask 346 and trenches 310 may be formed as described in reference to FIG. 2A.

A thermal oxide layer 348 is formed at sidewalls and bottoms 314 of the trenches 310. In the instant example, the thermal oxide layer 348 is sufficiently thick to provide the complete dielectric liner 312 disposed on the sidewalls of the trenches 310 between the upper field plate segment 324 of FIG. 3 and the substrate 302, for example, 70 nanometers to 80 nanometers thick for an operating voltage of 40 volts. A deposited silicon dioxide layer 350 is formed on the thermal oxide layer 348. The deposited silicon dioxide layer 350 may be 130 nanometers to 170 nanometers thick, formed by an SACVD process or a PECVD process.

A lower field plate segment 322 is formed in the trenches 310 on the deposited silicon dioxide layer 350, for example as described in reference to FIG. 2B and FIG. 2C. The thermal oxide layer 348 combined with the deposited silicon dioxide layer 350 provide the dielectric liner 312 separating the lower field plate segment 322 from the substrate 302.

A first blanket oxide etchback process removes at least portion, and possibly all, of the deposited silicon dioxide layer 350 from the trenches 310 above the lower field plate segment 322. The lower field plate segment 322 prevents removal of the deposited silicon dioxide layer 350 from the trenches 310 below a top of the lower field plate segment 322. In the instant example, substantially all of the thermal oxide layer 348 remains on sidewalls of the trenches 310 after the first blanket oxide etchback process is completed. The first blanket oxide etchback process exposes a top of the lower field plate segment 322.

Figure 4B:
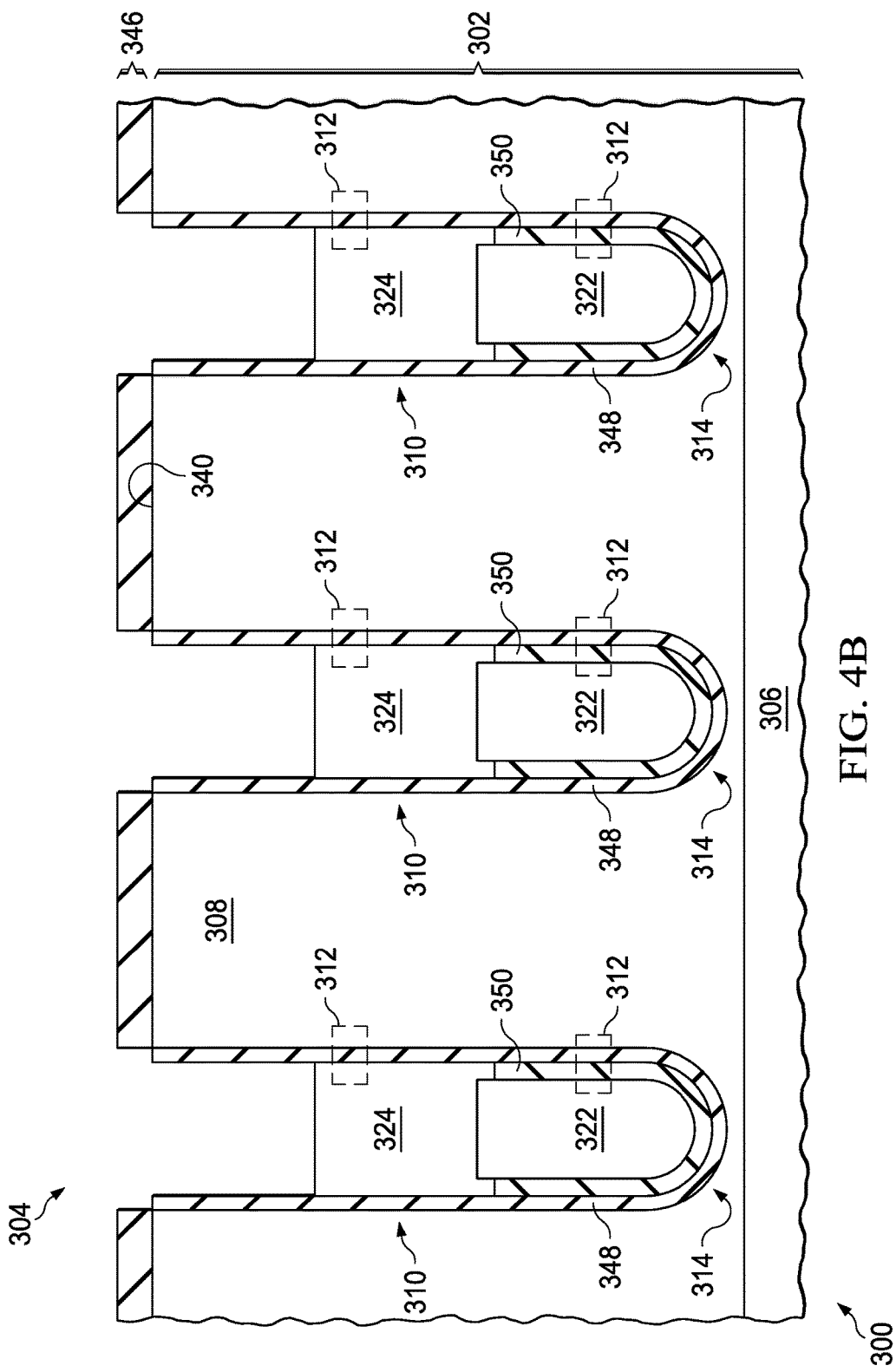

Referring to FIG. 4B, an upper field plate segment 324 is formed on the thermal oxide layer 348 and on the lower field plate segment 322 in the trenches 310, for example as described in reference to FIG. 2F. In the instant example, the thermal oxide layer 348 provides the dielectric liner 312 separating the upper field plate segment 324 from the substrate 302, which may advantageously reduce fabrication complexity and cost of the semiconductor device 300.

Figure 4C:
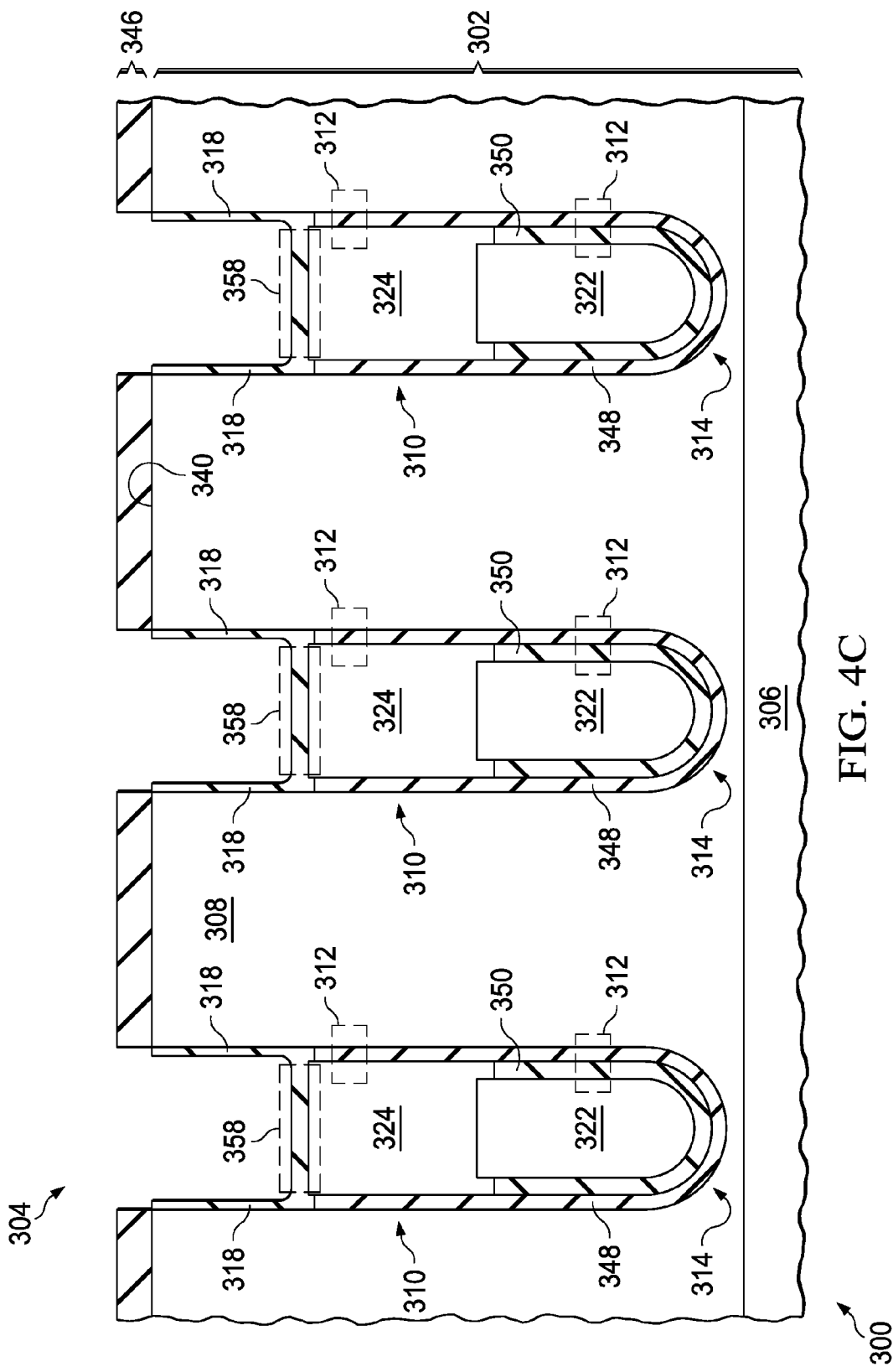

Referring to FIG. 4C, a second blanket oxide etchback process removes the thermal oxide layer 348 from the trenches 310 above the upper field plate segment 324. The upper field plate segment 324 prevents removal of the thermal oxide layer 348 from the trenches 310 below a top of the upper field plate segment 324. The second blanket oxide etchback process may be performed so that substantially no semiconductor material is removed from the substrate 302.

The gate dielectric layer 318 is formed on sidewalls of the trenches 310 above the upper field plate segment 324, and dielectric material 358 is concurrently formed on the upper field plate segment 324. The gate dielectric layer 318 may be formed by thermal oxidation, or a combination of thermal oxidation and deposition of dielectric material. Removing the thermal oxide layer 348 so as to expose the sidewalls of the trenches 310 advantageously improves process control of a thickness of the gate dielectric layer 318. The dielectric material 358 on the upper field plate segment 324 may be thicker than the gate dielectric layer 318 due to a higher thermal oxide growth rate on polysilicon compared to crystalline silicon.

Figure 4D:
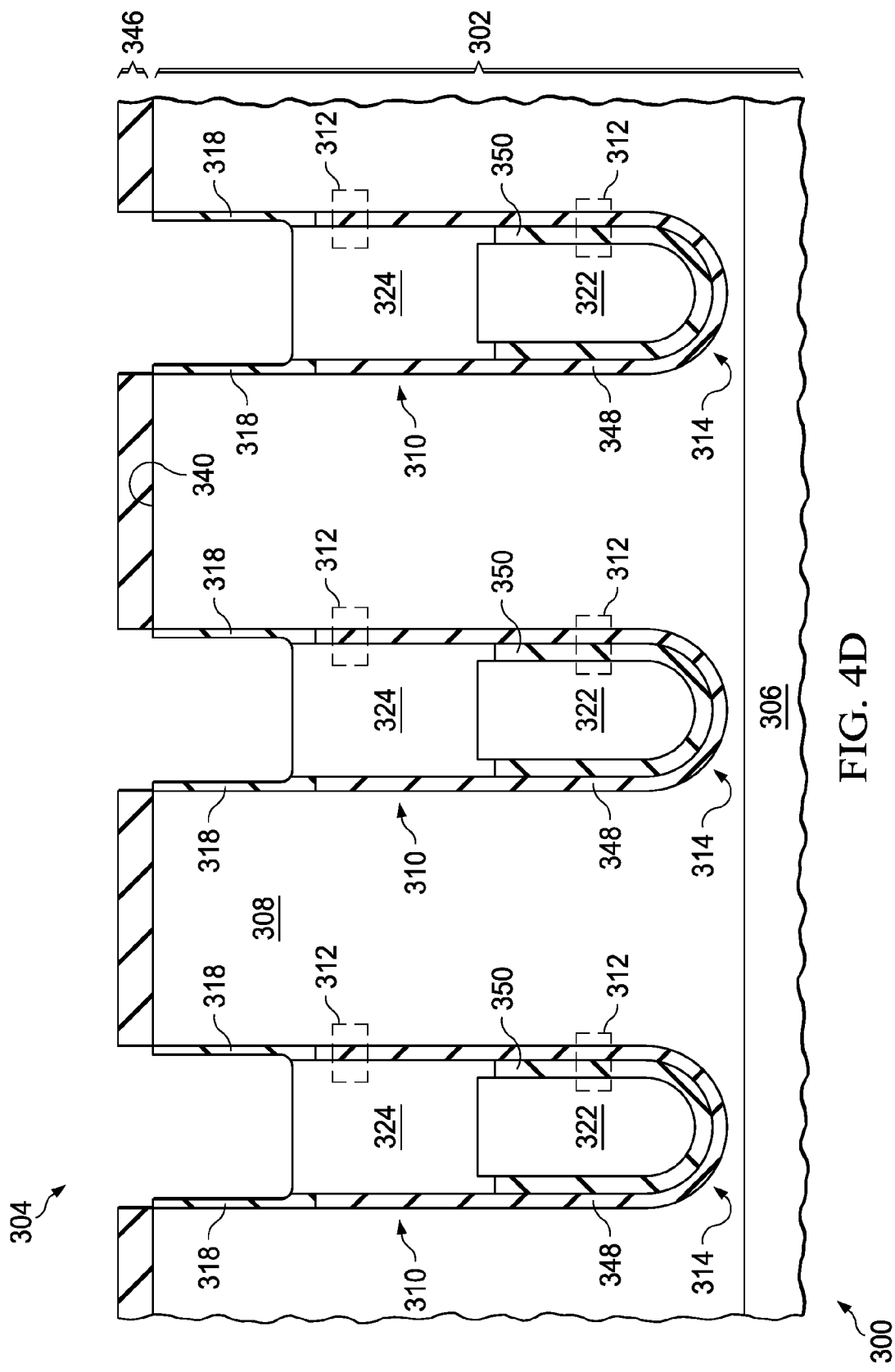

Referring to FIG. 4D, an anisotropic etch process such as an RIE process removes the dielectric material 358 of FIG. 4C from the top of the upper field plate segment 324 without significantly degrading the gate dielectric layer 318. In one version of the instant example, the gate dielectric layer 318 may be protected by a sacrificial layer of polysilicon or silicon nitride, while the dielectric material 358 is removed, after which the sacrificial layer is removed without significantly degrading the gate dielectric layer 318.

Figure 4E:
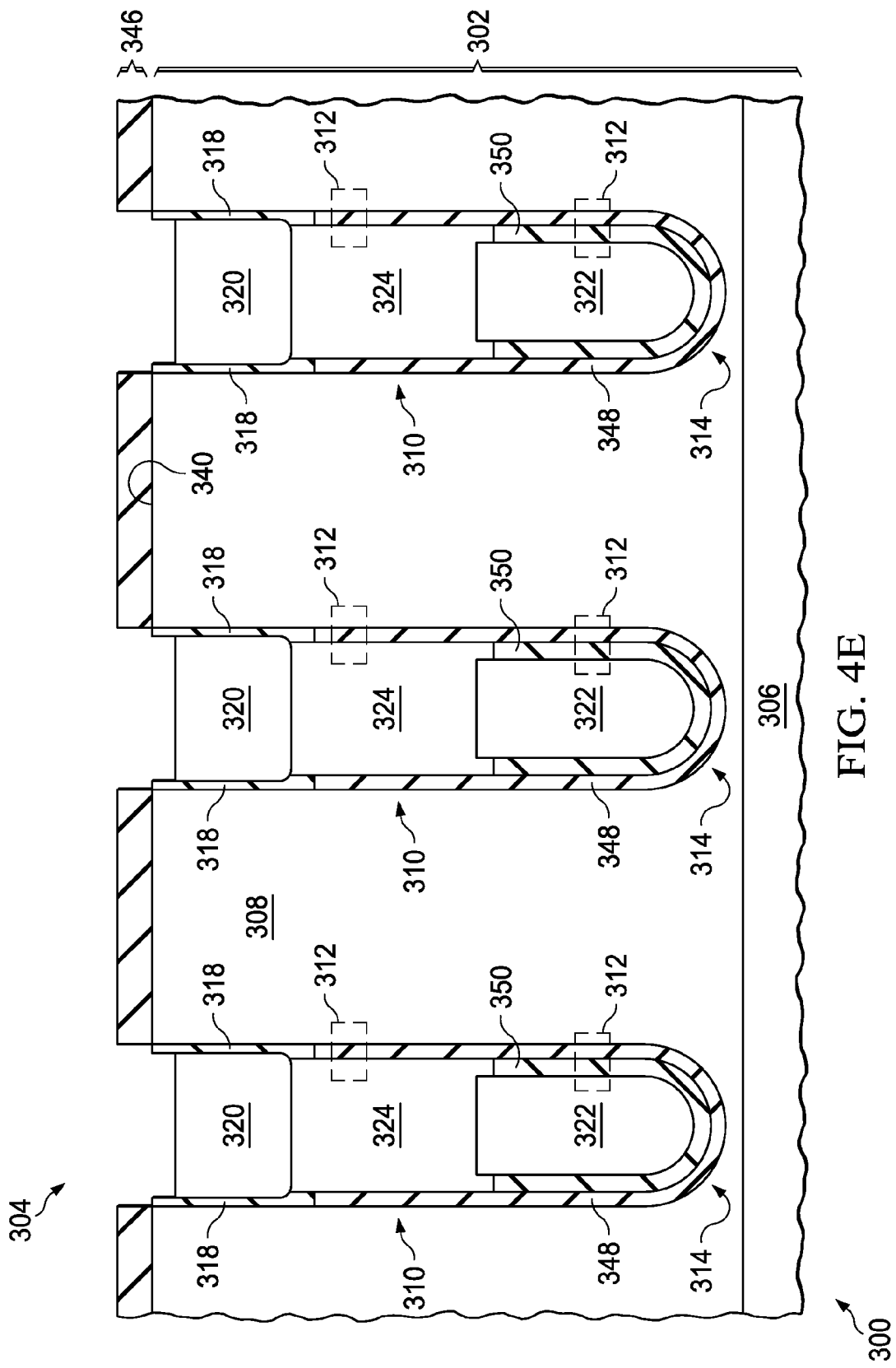

Referring to FIG. 4E, the trench gate 320 is formed contacting the gate dielectric layer 318 and the upper field plate segment 324. The trench gate 320 may be formed as described in reference to FIG. 2I and FIG. 2J. In the instant example, removing the dielectric material 358 of FIG. 4C from the top of the upper field plate segment 324 enables the trench gate 320 to make electrical contact with the upper field plate segment 324. Further fabrication provides the structure of FIG. 3.

Figure 5:
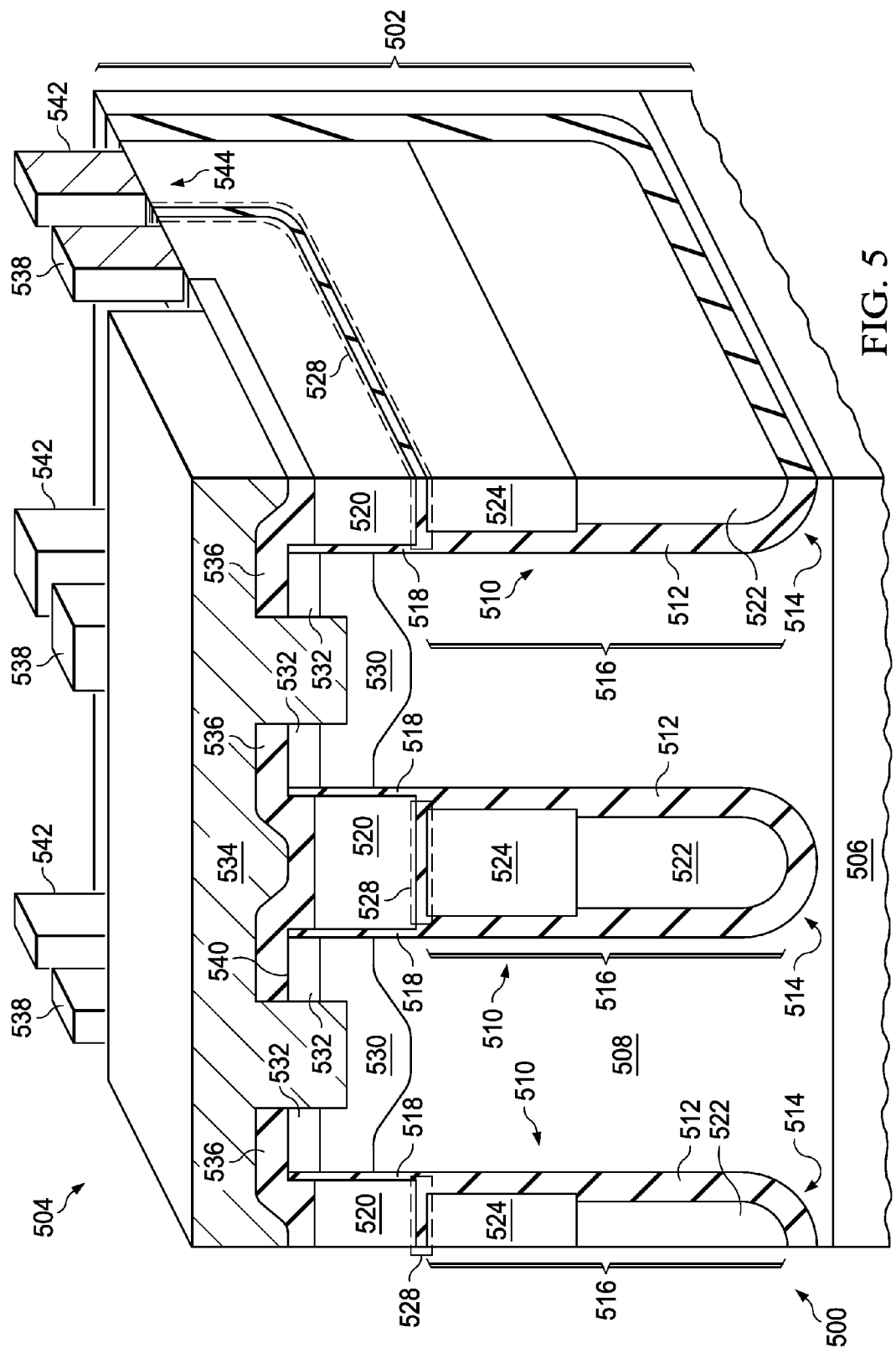
FIG. 5 is a cross section of an example semiconductor device containing a vertical p-channel MOS transistor.

FIG. 5 is a cross section of an example semiconductor device containing a vertical p-channel MOS transistor. The semiconductor device 500 is formed on a substrate 502 which comprises a semiconductor material. The p-channel vertical MOS transistor 504, referred to herein as the transistor 504, includes a p-type drain region 506 disposed in the substrate 502 below a p-type vertical drift region 508.

The semiconductor device 500 includes trenches 510 which extend vertically through the vertical drift region 508 proximate to the drain region 506, or possibly into the drain region 506. The trenches 510 contain a dielectric liner 512 extending to bottoms 514 of the trenches 510 and abutting the substrate 502, and a plurality of field plate segments 516 on the dielectric liner 512. The trenches 510 further contain a gate dielectric layer 518 above the dielectric liner 512 abutting the substrate 502, and a trench gate 520 of the transistor 504 contacting the gate dielectric layer 518. In the instant example, the plurality of field plate segments 516 includes a lower field plate segment 522 on the dielectric liner 512 at the bottoms 514 of the trenches 510, and an upper field plate segment 524 disposed above the lower field plate segment 522. The plurality of field plate segments 516 and the trench gate 520 may include primarily p-type polysilicon. The dielectric liner 512 may include primarily silicon dioxide. The dielectric liner 512 separates the lower field plate segment 522 and the upper field plate segment 524 from the substrate 502. The dielectric liner 512 separating the lower field plate segment 522 from the substrate 502 is thicker than the dielectric liner 512 separating the upper field plate segment 524 from the substrate 502. The dielectric liner 512 disposed on the sidewalls of the trenches 510 between the upper field plate segment 524 and the substrate 502 is thicker than the gate dielectric layer 518 disposed on the sidewalls of the trenches 510 between the trench gate 520 and the substrate 502. For example, in a version of the instant example in which the transistor 504 is designed to operate up to 100 volts, the dielectric liner 512 disposed on the sidewalls of the trenches 510 between the lower field plate segment 522 and the substrate 502 may be 400 nanometers to 500 nanometers thick, and the dielectric liner 512 disposed on the sidewalls of the trenches 510 between the upper field plate segment 524 and the substrate 502 may be 150 nanometers to 200 nanometers thick.

In the instant example, the lower field plate segment 522 is contacting the upper field plate segment 524 in the trenches 510. The upper field plate segment 524 is isolated from the trench gate 520 by an isolation layer 528, disposed between the upper field plate segment 524 and the trench gate 520. A bias voltage applied to the upper field plate segment 524 in the instant example also biases the lower field plate segment 522 to the same bias voltage.

The transistor 504 includes an n-type body 530 in the substrate 502 above the vertical drift region 508, abutting the gate dielectric layer 518. The transistor 504 further includes a p-type source 532 above the body 530 and abutting the gate dielectric layer 518. The trench gate 520 is partially coextensive with the vertical drift region 508 and the source 532. A source electrode 534 is disposed over the substrate 502 making electrical contact to the source 532 and the body 530. The source electrode 534 is electrically isolated from the trench gate 520 by a dielectric cap layer 536 over the trench gate 520. Other configurations for the source electrode 534 with respect to the source 532 and body 530 are within the scope of the instant example.

In one version of the instant example, in which the transistor 504 is designed to operate up to 100 volts, the trenches 510 may be 6 microns to 7 microns deep and 1.2 microns to 1.4 microns wide. The vertical drift region 508 may be 0.5 microns to 2.0 microns wide, that is, between adjacent trenches 510, and have an average doping density of $1.8 \times 10^{16}$ cm$^{-3}$ to $2.0 \times 10^{16}$ cm$^{-3}$.

Electrical connection to the trench gate 520 may be made through gate contacts 538 on exposed areas of the gate at a top surface 540 of the substrate 502. Electrical connections to the plurality of field plate segments 516 may be made through combined field plate contacts 542 on field plate risers 544 which extend from the plurality of field plate segments 516 up to the top surface 540 of the substrate 502. Other structures for making electrical connections to the trench gate 520 and the plurality of field plate segments 516 are within the scope of the instant example. Forming the upper field plate segment 524 to be isolated from the trench gate 520 may advantageously enable biasing the plurality of field plate segments 516 independently so as to increase current density in the transistor 504, while forming the lower field plate segment 522 to contact the upper field plate segment 524 in the trenches 510, so that electrical connections to the upper field plate segment 524 and the lower field plate segment 522 may be made through the combined field plate contacts 542 may advantageously reduce complexity and fabrication cost of the semiconductor device 500.

During operation of the semiconductor device 500, the trench gate 520 advantageously provides higher current density as explained in reference to FIG. 1. The plurality of field plate segments 516 provides a RESURF configuration to maintain an electric field in the vertical drift region 508 at a desired value, as explained in reference to FIG. 1. Hence forming the vertical MOS transistor 504 with the combination of the upper field plate segment 524 and the lower field plate segment 522 enables the transistor 504 to have shallower trenches 510 than the similar vertical MOS transistor with a single field plate, advantageously reducing a fabrication cost of the semiconductor device 500.

Figure 6A:
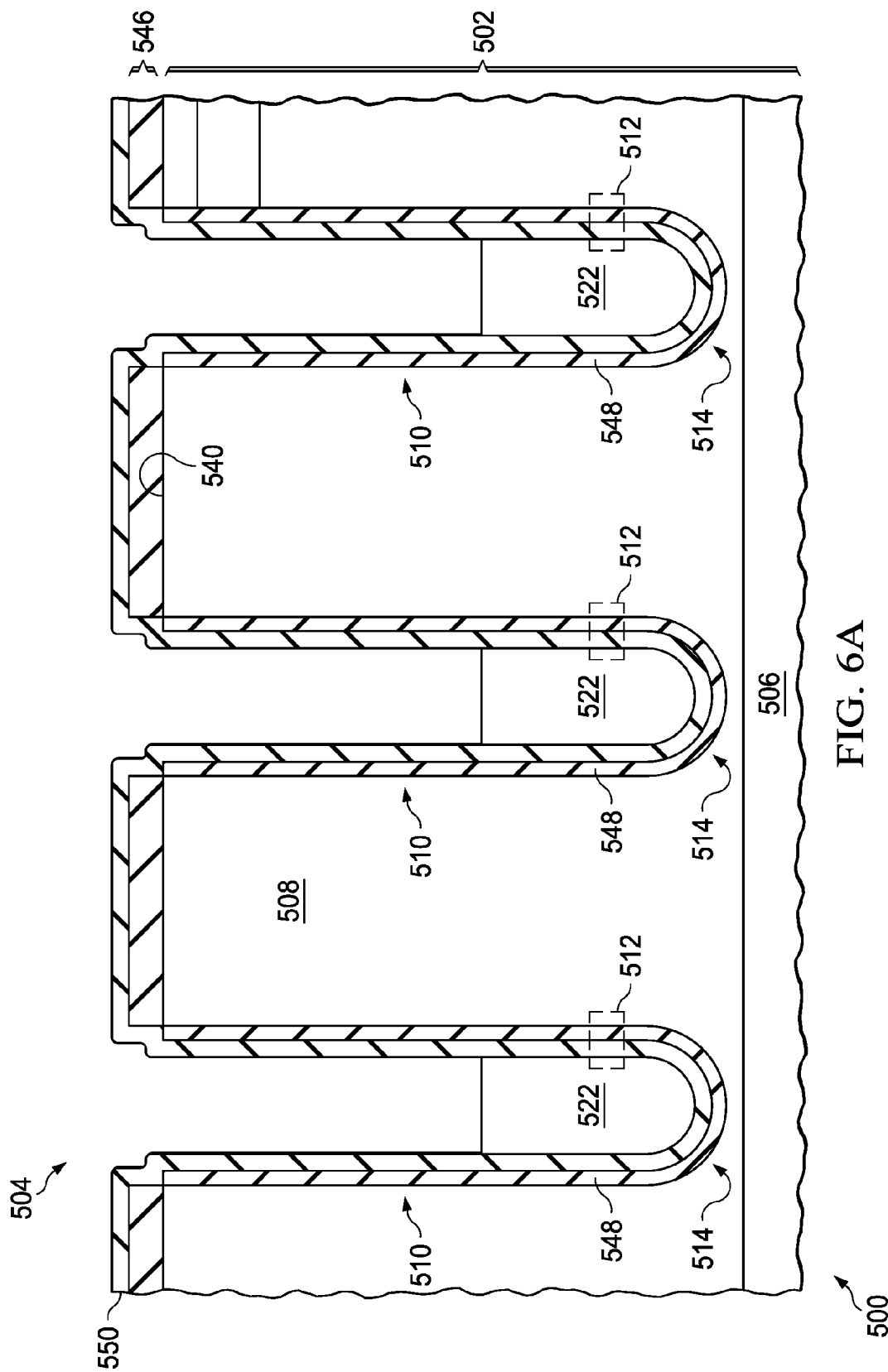
FIG. 6A through FIG. 6H are cross sections of the semiconductor device of FIG. 5, depicted in successive stages of fabrication.

FIG. 6A through FIG. 6H are cross sections of the semiconductor device of FIG. 5, depicted in successive stages of fabrication. Referring to FIG. 6A, the semiconductor device 500 is formed on the substrate 502. The drain region 506 is formed in the substrate 502 to have a doping density greater than $1\times10^{20}$ cm$^{-3}$. P-type dopants such as boron in the vertical drift region 508 may be incorporated during epitaxial growth or may be implanted later. A hard mask 546 is formed over the substrate 502 which exposes areas for the trenches 510. The trenches 510 are formed by removing material from the substrate 502 in the areas exposed by the hard mask 546. The drain region 506, hard mask 546 and trenches 510 may be formed as described in reference to FIG. 2A.

A first thermal oxide layer 548 is formed at sidewalls and bottoms 514 of the trenches 510. A deposited silicon dioxide layer 550 is formed on the first thermal oxide layer 548, by an SACVD process or a PECVD process. A lower field plate segment 522 is formed in the trenches 510 on the deposited silicon dioxide layer 550, for example as described in reference to FIG. 2B and FIG. 2C. In the instant example, the lower field plate segment 522 may be p-type polysilicon to provide an effective charge balance in the RESURF structure of the vertical drift region 508. The first thermal oxide layer 548 combined with the deposited silicon dioxide layer 550 provide the dielectric liner 512 separating the lower field plate segment 522 from the substrate 502. In the instant example, the first thermal oxide layer 548 may be, for example, 70 nanometers to 80 nanometers thick, and the deposited silicon dioxide layer 550 may be 330 nanometers to 420 nanometers thick, for an operating voltage of 100 volts.

Figure 6B:
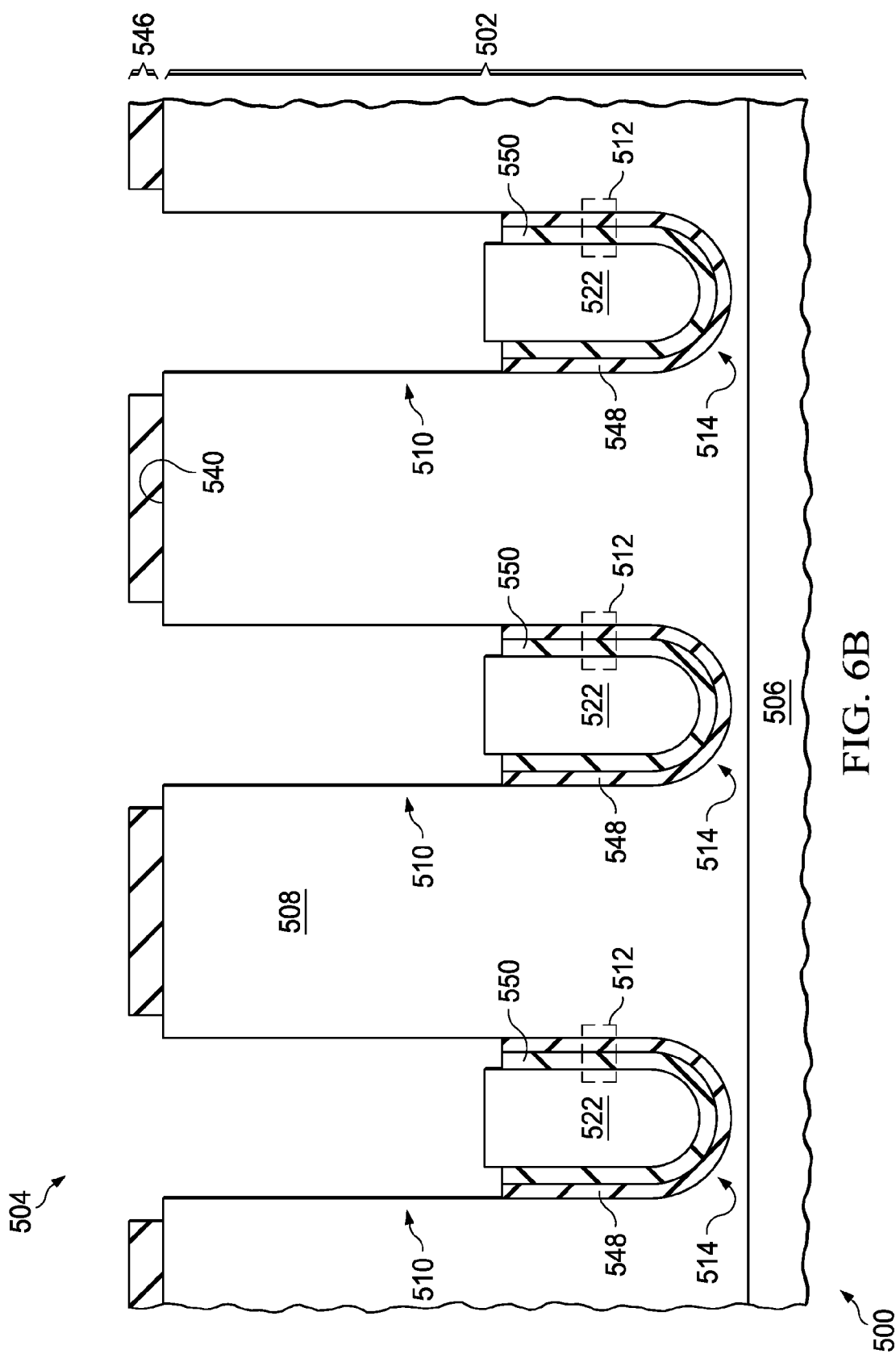

Referring to FIG. 6B, a first blanket oxide etchback process removes substantially all of the dielectric liner 512, both the first thermal oxide layer 548 and the deposited silicon dioxide layer 550, from the trenches 510 above the lower field plate segment 522. The lower field plate segment 522 prevent removal of the dielectric liner 512 from the trenches 510 below tops of the lower field plate segment 522. The first blanket oxide etchback process may include, for example, a timed wet etch using a buffered hydrofluoric acid solution.

Figure 6C:
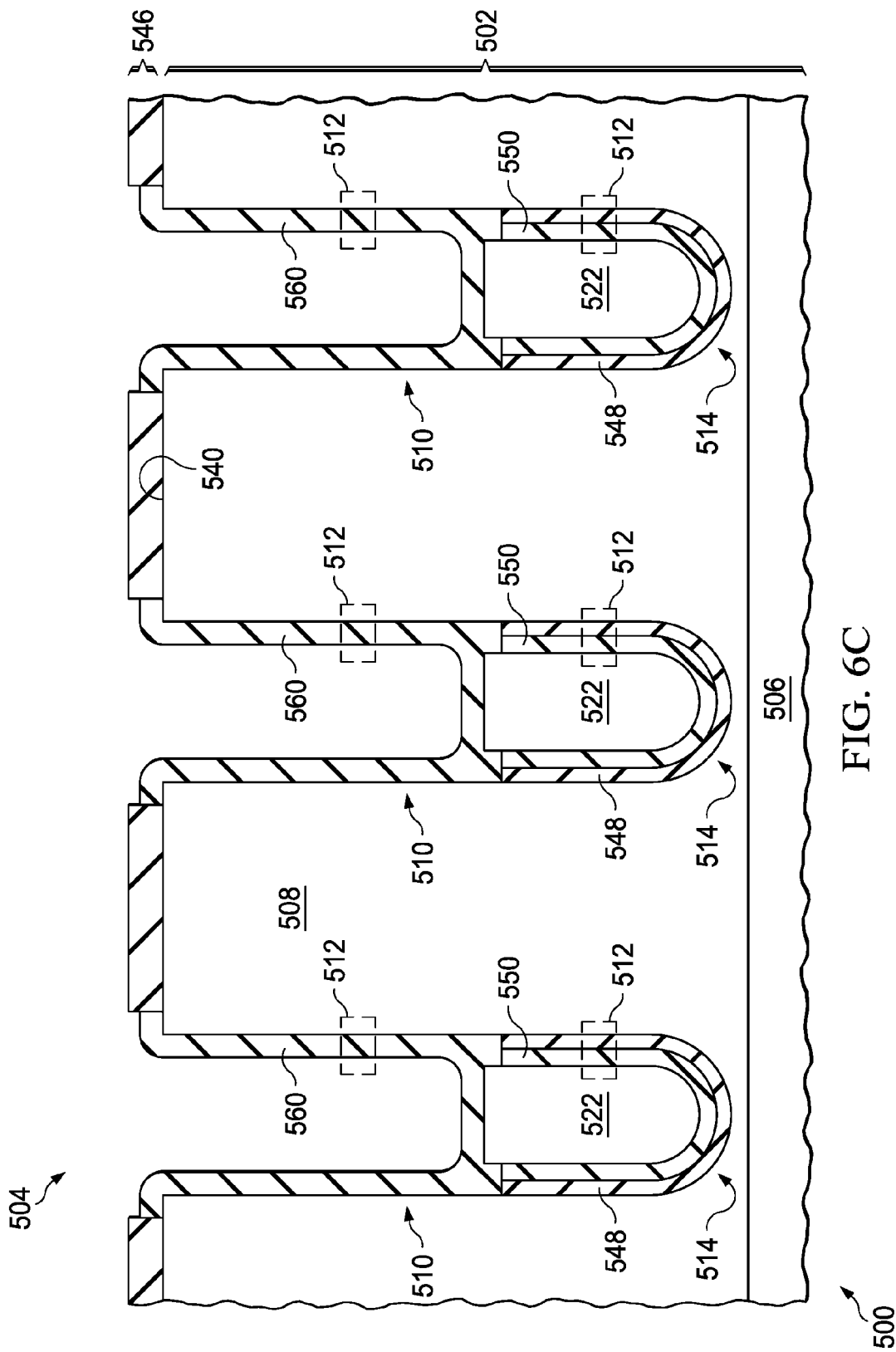

Referring to FIG. 6C, a second thermal oxide layer 560 is formed at sidewalls of the trenches 510 above the lower field plate segment 522, and on a top surface of the lower field plate segment 522. In the instant example, the second thermal oxide layer 560 provides the dielectric liner 512 between the upper field plate segment 524 of FIG. 5 and the substrate 502. The second thermal oxide layer 560 may be 150 nanometers to 200 nanometers thick to provide 100 volt operation for the transistor 504.

Figure 6D:
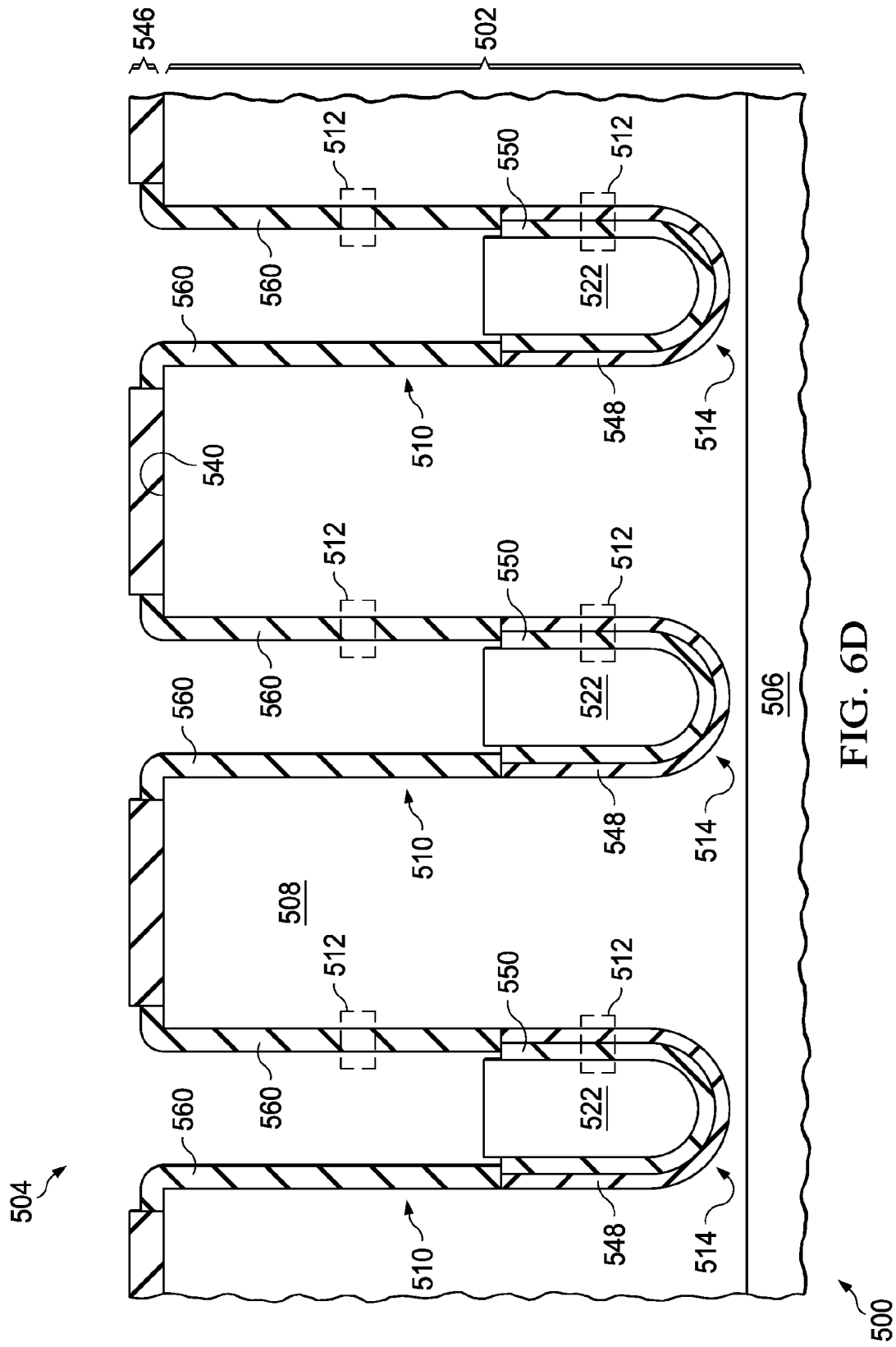

Referring to FIG. 6D, an anisotropic etch process such as an RIE process removes the second thermal oxide layer 560 from the top surface of the lower field plate segment 522, so as to expose the top surface of the lower field plate segment 522. The anisotropic etch process is performed so as to avoid significantly degrading the second thermal oxide layer 560 on the sidewalls of the trenches 510. The anisotropic etch process may form a protective polymer on the second thermal oxide layer 560 on the sidewalls of the trenches 510, which is subsequently removed after the top surface of the lower field plate segment 522 is exposed.

Figure 6E:
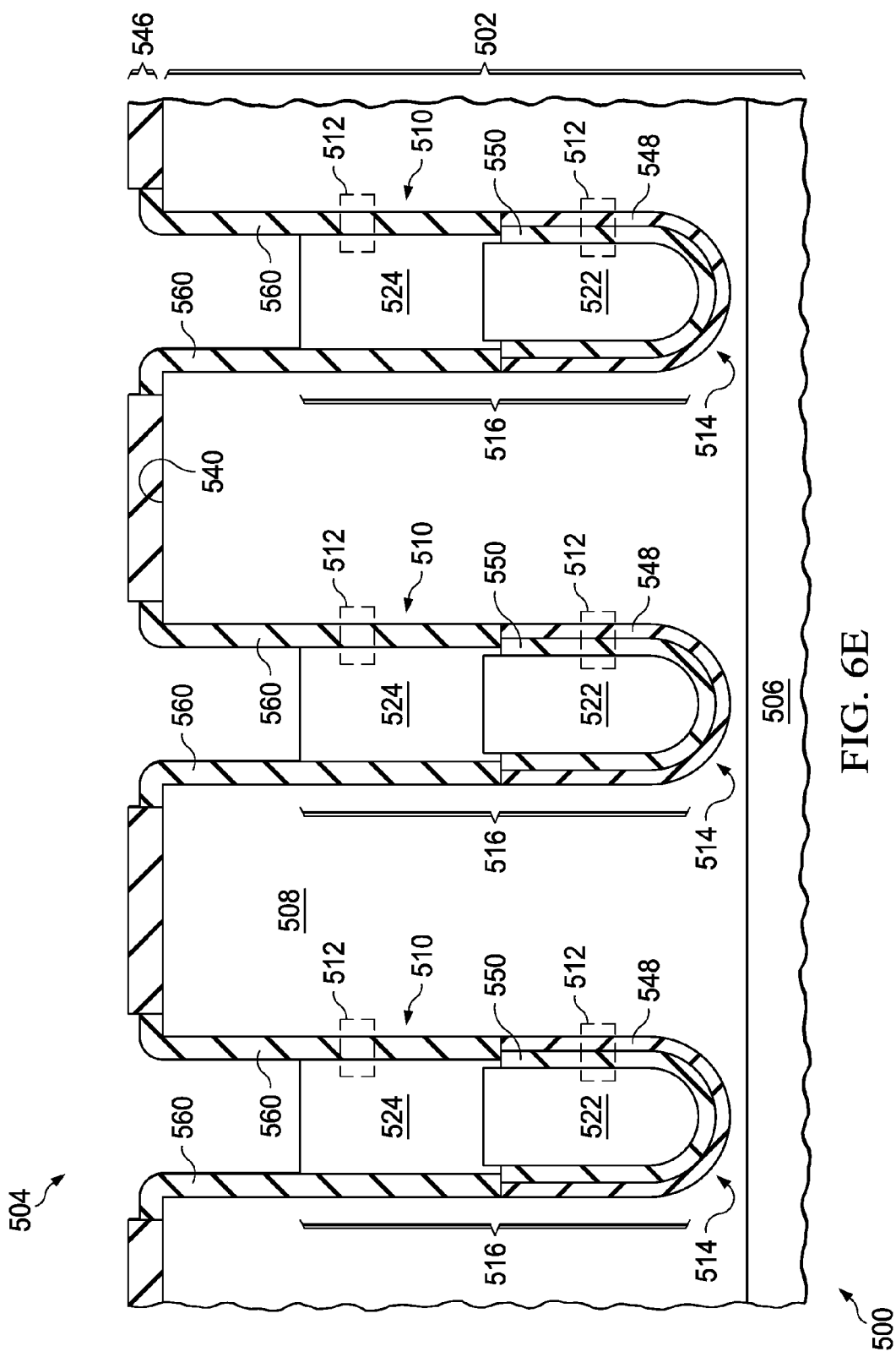

Referring to FIG. 6E, an upper field plate segment 524 is formed on the second thermal oxide layer 560 and on the lower field plate segment 522 in the trenches 510, for example as described in reference to FIG. 2F. In the instant example, the upper field plate segment 524 may be p-type polysilicon, as explained in reference to FIG. 6E. In the instant example, the second thermal oxide layer 560 provides the dielectric liner 512 separating the upper field plate segment 524 from the substrate 502, which may advantageously reduce fabrication complexity and cost of the semiconductor device 500 be eliminating need to form a second dielectric layer in the dielectric liner 512 separating the upper field plate segment 524 from the substrate 502.

Figure 6F:
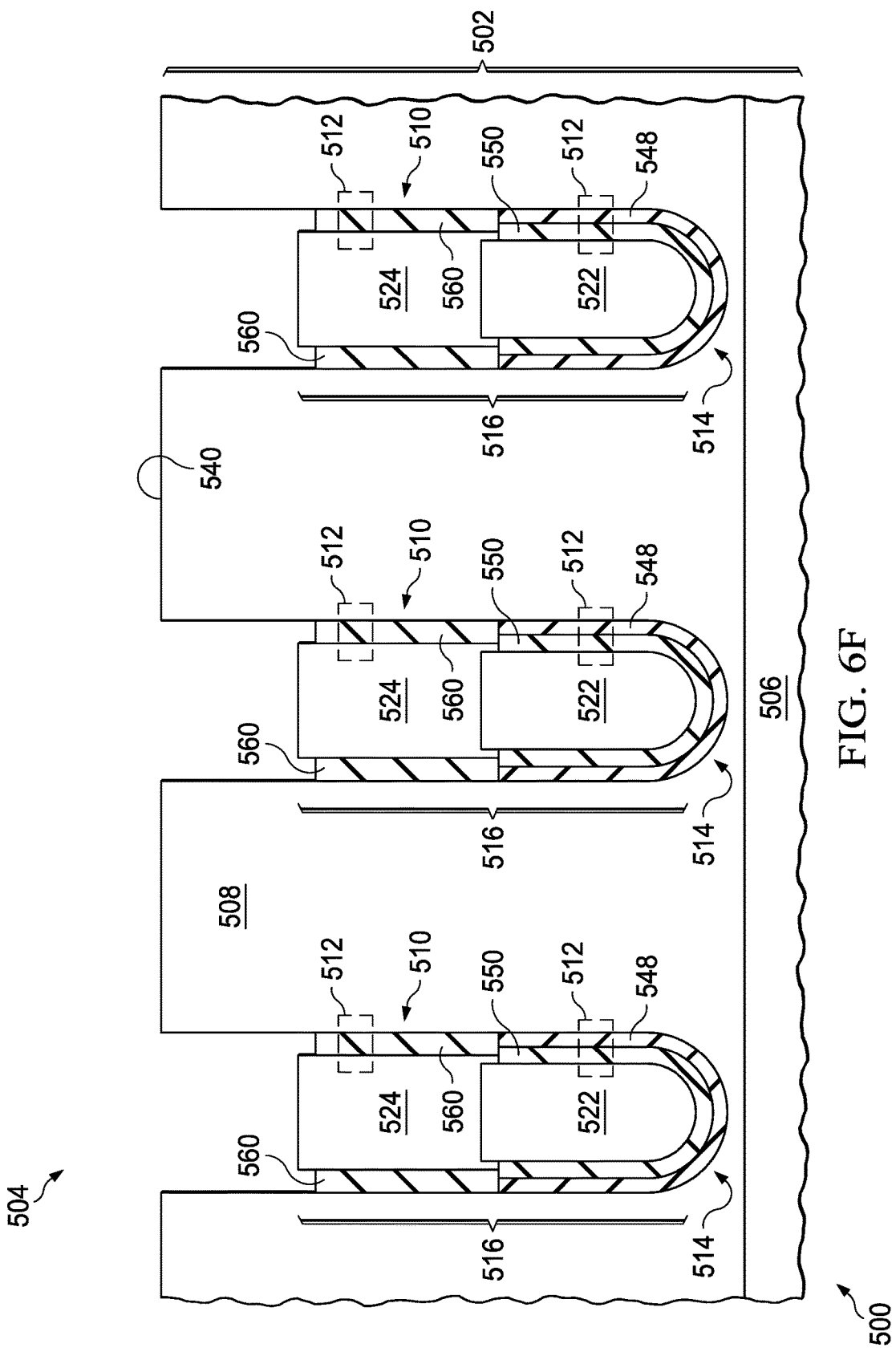

Referring to FIG. 6F, a second blanket oxide etchback process removes the second thermal oxide layer 560 from the trenches 510 above the upper field plate segment 524. The upper field plate segment 524 prevents removal of the second thermal oxide layer 560 from the trenches 510 below a top of the upper field plate segment 524. The second blanket oxide etchback process may be performed so that substantially no semiconductor material is removed from the substrate 502. The hard mask 546 of FIG. 6E may be removed by the second blanket etchback so as to expose the top surface 540 of the substrate 502, as depicted in FIG. 6F.

Figure 6G:
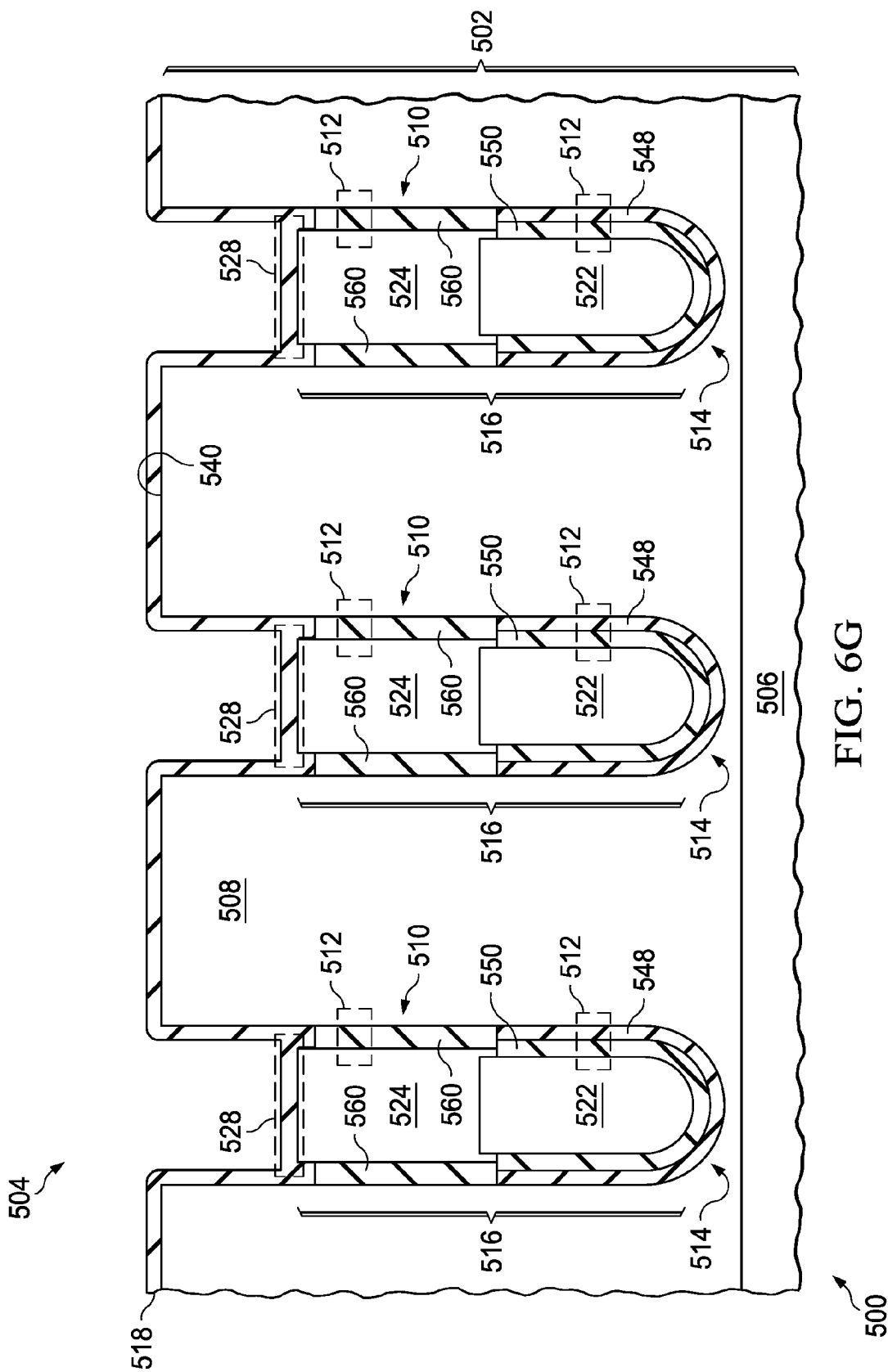

Referring to FIG. 6G, the gate dielectric layer 518 is formed on sidewalls of the trenches 510 and the isolation layer 528 is formed on a top surface of the upper field plate segment 524, concurrently. In the instant example, if the top surface 540 of the substrate 502 is exposed by the second blanket etchback discussed in reference to FIG. 6F, the gate dielectric layer 518 may also be formed on the top surface 540 as depicted in FIG. 6G. The gate dielectric layer 518 and the isolation layer 528 may be formed by thermal oxidation, or a combination of thermal oxidation and deposition of dielectric material. Thermal oxide in the isolation layer 528 may be thicker than thermal oxide in the gate dielectric layer 518, due to a higher thermal oxide growth rate on polysilicon compared to crystalline silicon.

Figure 6H:
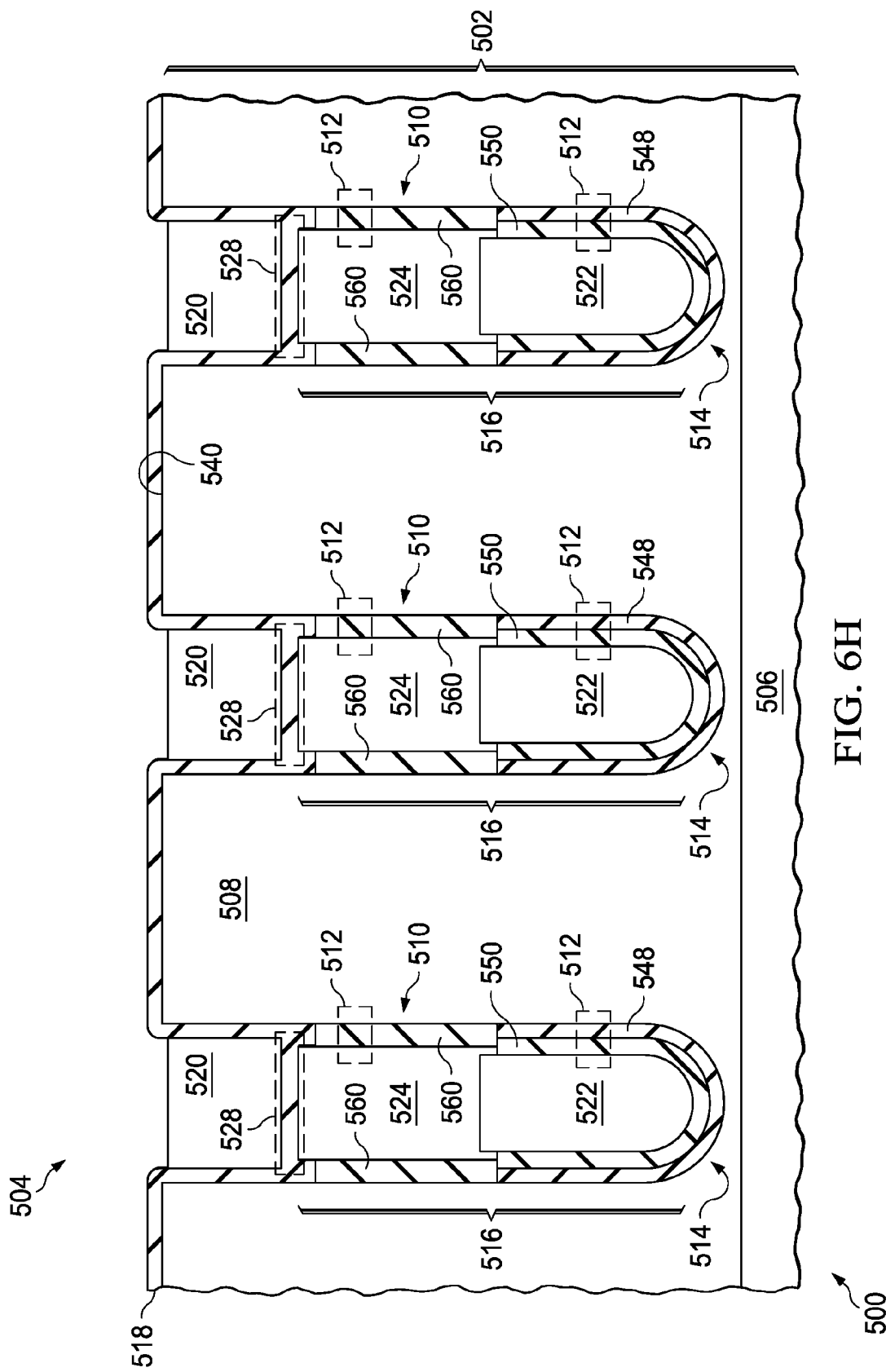

Referring to FIG. 6H, the trench gate 520 is formed contacting the gate dielectric layer 518 and the isolation layer 528. The trench gate 520 may be formed as described in reference to FIG. 2I and FIG. 2J. In the instant example, the isolation layer 528 on the top of the upper field plate segment 524 electrically isolates the plurality of field plate segments 516 from the trench gate 520, enabling an independent bias of the plurality of field plate segments 516 with respect to the trench gate 520. Further fabrication provides the structure of FIG. 5.

Figure 7:
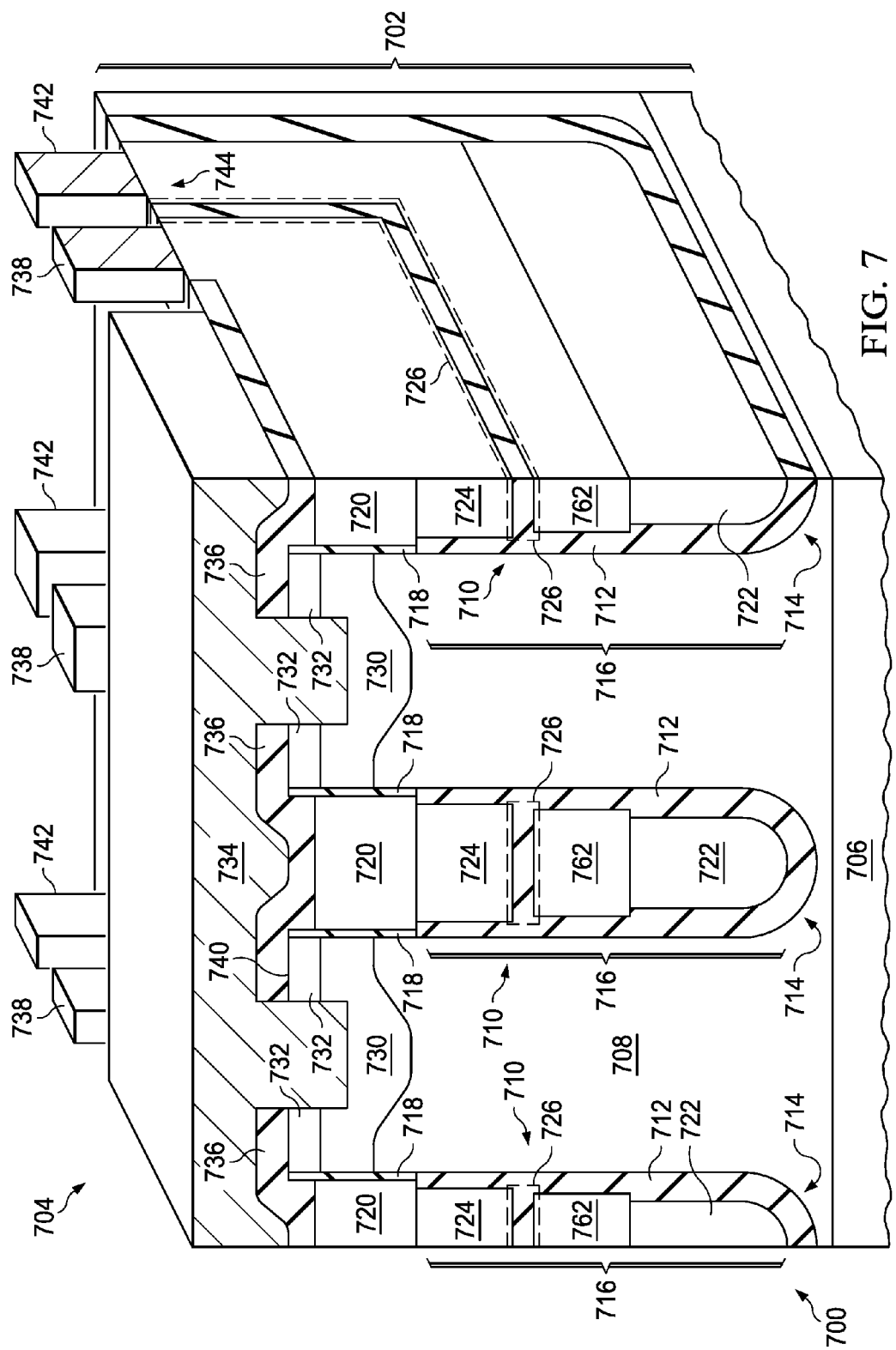
FIG. 7 is a cross section of another example semiconductor device containing a vertical n-channel MOS transistor.

FIG. 7 is a cross section of another example semiconductor device containing a vertical n-channel MOS transistor. The semiconductor device 700 is formed on a substrate 702 which comprises a semiconductor material. The n-channel vertical MOS transistor 704, referred to herein as the transistor 704, includes an n-type drain region 706 disposed in the substrate 702 below an n-type vertical drift region 708.

The semiconductor device 700 includes trenches 710 which extend vertically through the vertical drift region 708 proximate to the drain region 706, or possibly into the drain region 706. The trenches 710 contain a dielectric liner 712 extending to bottoms 714 of the trenches 710 and abutting the substrate 702, and a plurality of field plate segments 716 on the dielectric liner 712. The trenches 710 further contain a gate dielectric layer 718 above the dielectric liner 712 abutting the substrate 702, and a trench gate 720 of the transistor 704 contacting the gate dielectric layer 718. In the instant example, the plurality of field plate segments 716 includes a lower field plate segment 722 on the dielectric liner 712 at the bottoms 714 of the trenches 710, a middle field plate segment 762 disposed above the lower field plate segment 722, and an upper field plate segment 724 disposed above the middle field plate segment 762 and below the trench gate 720. The plurality of field plate segments 716 and the trench gate 720 may include primarily n-type polysilicon. The dielectric liner 712 may include primarily silicon dioxide. The dielectric liner 712 separates the lower field plate segment 722, the middle field plate segment 762 and the upper field plate segment 724 from the substrate 702. The dielectric liner 712 separating the lower field plate segment 722 from the substrate 702 is thicker than the dielectric liner 712 separating the middle field plate segment 762 from the substrate 702, which is in turn thicker than the dielectric liner 712 separating the upper field plate segment 724 from the substrate 702. The dielectric liner 712 disposed on the sidewalls of the trenches 710 between the upper field plate segment 724 and the substrate 702 is thicker than the gate dielectric layer 718 disposed on the sidewalls of the trenches 710 between the trench gate 720 and the substrate 702.

In the instant example, the lower field plate segment 722 is contacting the middle field plate segment 762 in the trenches 710, and the upper field plate segment 724 is contacting the trench gate 720 in the trenches 710, while the middle field plate segment 762 is separated from the upper field plate segment 724 by an isolation layer 726, disposed between the upper field plate segment 724 and the trench gate 720. A bias voltage applied to the trench gate 720 is also thus applied to the upper field plate segment 724 in the instant example, while an independent bias voltage applied to the middle field plate segment 762 also biases the lower field plate segment 722 to the same independent bias voltage.

The transistor 704 includes a p-type body 730 in the substrate 702 above the vertical drift region 708, abutting the gate dielectric layer 718. The transistor 704 further includes an n-type source 732 above the body 730 and abutting the gate dielectric layer 718. The trench gate 720 is partially coextensive with the vertical drift region 708 and the source 732. A source electrode 734 is disposed over the substrate 702 making electrical contact to the source 732 and the body 730. The source electrode 734 is electrically isolated from the trench gate 720 by a dielectric cap layer 736 over the trench gate 720. Other configurations for the source electrode 734 with respect to the source 732 and body 730 are within the scope of the instant example.

Electrical connection to the trench gate 720 and the upper field plate segment 724 may be made through gate contacts 738 on exposed areas of the gate at a top surface 740 of the substrate 702. Electrical connections to the middle field plate segment 762 and the lower filed plate segment 722 may be made through combined field plate contacts 742 on field plate risers 744 which extend from the middle field plate segment 762 up to the top surface 740 of the substrate 702. Other structures for making electrical connections to the trench gate 720 and the middle field plate segment 762 are within the scope of the instant example. Forming the trench gate 720 and the upper field plate segment 724 to be isolated from the middle field plate segment 762 and the lower field plate segment 722 may advantageously enable a balance of the advantages of independent biases for the trench gate 720 and the plurality of field plate segments 716 as discussed in reference to FIG. 1, and the advantages of the combined field plate contacts 742 as discussed in reference to FIG. 3.

During operation of the semiconductor device 700, the trench gate 720 advantageously provides higher current density as explained in reference to FIG. 1. The plurality of field plate segments 716 provides a RESURF configuration to maintain an electric field in the vertical drift region 708 at a desired value, as explained in reference to FIG. 1. Hence forming the vertical MOS transistor 704 with the combination of the upper field plate segment 724 and the lower field plate segment 722 enables the transistor 704 to have shallower trenches 710 than the similar vertical MOS transistor with a single field plate, advantageously reducing a fabrication cost of the semiconductor device 700.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit, comprising:
  a vertical metal oxide semiconductor transistor including:
    a vertical drift region;
    a body region positioned above the vertical drift region
    a trench defined vertically into the body region and the vertical drift region;
    a trench gate positioned in the trench and adjacent to the body region;
    a field plate positioned in the trench and adjacent to the vertical drift region;
    a first dielectric liner disposed on a sidewall of the trench and separating the field plate from the vertical drift region, the first dielectric liner having a first thickness; and
    a second dielectric liner disposed on the sidewall and positioned above the first dielectric liner, the second dielectric liner separating the field plate from the vertical drift region and having a second thickness less than the first thickness.

2. The integrated circuit of claim 1, further comprising:
an isolation layer positioned between the field plate and the trench gate, the isolation layer isolating the field plate from the trench gate.

3. The integrated circuit of claim 1, wherein the field plate is contiguous with the trench gate.

4. The integrated circuit of claim 1, wherein:
the field plate has a first width associated with a lower segment and a second width associated with an upper segment; and
the first width is less than the second width.

5. The integrated circuit of claim 4, wherein the lower segment is contiguous with the upper segment.

6. The integrated circuit of claim 4, further comprising:
an isolation layer positioned between the lower segment and the upper segment and isolating the lower segment from the upper segment.

7. The integrated circuit of claim 1, further comprising:
a gate dielectric layer disposed on the sidewall and separating the trench gate from the body region, the gate dielectric layer having a third thickness less than the second thickness of the second dielectric liner.

8. The integrated circuit of claim 1, wherein:
the first dielectric liner includes a first thermal oxide layer disposed on the sidewall of the trench and having a third thickness less than the first thickness and the second thickness; and
the second dielectric liner includes a second thermal oxide layer contiguous with the first thermal oxide layer and having the third thickness.

9. The integrated circuit of claim 8, wherein:
the first dielectric liner includes a first silicon dioxide layer disposed on the first thermal oxide layer and having a fourth thickness less than the first thickness and the second thickness; and
the second dielectric liner includes a second silicon dioxide layer contiguous with the first silicon dioxide layer and having a fifth thickness less than the fourth thickness.

10. The integrated circuit of claim 1, further comprising:
a source region positioned above the body region and adjacent to the trench, the source region electrically coupled to the field plate; and
a drain region positioned under the vertical drift region, the drain region spaced apart from the trench.

* * * * *